United States Patent
Gao et al.

(10) Patent No.: US 7,292,699 B2
(45) Date of Patent: Nov. 6, 2007

(54) BAND-LIMITED ADAPTIVE FEEDBACK CANCELLER FOR HEARING AIDS

(75) Inventors: Shawn X. Gao, Cerritos, CA (US); Sigfrid D. Soli, Sierra Madre, CA (US); Hsiang-Feg Chi, Los Angeles, CA (US)

(73) Assignee: House Ear Institute, Los Angeles, CA (US)

( * ) Notice: Subject to any disclaimer, the term of this patent is extended or adjusted under 35 U.S.C. 154(b) by 17 days.

(21) Appl. No.: 11/089,399

(22) Filed: Mar. 23, 2005

(65) Prior Publication Data

US 2005/0163331 A1 Jul. 28, 2005

Related U.S. Application Data

(63) Continuation of application No. 09/409,163, filed on Sep. 30, 1999, now Pat. No. 6,876,751.

(60) Provisional application No. 60/102,557, filed on Sep. 30, 1998.

(51) Int. Cl.
*H04R 25/00* (2006.01)
(52) U.S. Cl. .................... 381/318; 381/83; 381/93; 381/320
(58) Field of Classification Search ........... 381/71.1, 381/71.14, 83, 93, 108, 94.1–94.9, 312–313, 381/317–318, 320
See application file for complete search history.

(56) References Cited

U.S. PATENT DOCUMENTS 5,016,280 A 5/1991 Engebretson et al.
5,091,952 A 2/1992 Williamson et al.
5,142,552 A 8/1992 Tzeng et al.
5,201,006 A 4/1993 Weinrich
5,259,033 A 11/1993 Goodings et al.
5,402,496 A 3/1995 Soli et al.
5,550,923 A 8/1996 Hotvet
5,768,398 A 6/1998 Janse et al.
5,910,994 A 6/1999 Lane et al.
6,876,751 B1 4/2005 Gao
2004/0101147 A1 5/2004 Arndt et al.

(Continued)

FOREIGN PATENT DOCUMENTS

EP 0 579 152 1/1994

(Continued)

OTHER PUBLICATIONS

Agnew, "Application of a Notch Filter To Reduce Acoustic Feedback," The Hearing Journal, vol. 46, No. 3, Mar. 1993, pp. 37-43.

(Continued)

*Primary Examiner*—Suhan Ni
(74) *Attorney, Agent, or Firm*—Blakely, Sokoloff, Taylor & Zafman LLP

(57) ABSTRACT

An improved method for adaptively cancelling acoustic feedback in hearing aids and other audio amplification devices. Feedback cancellation is limited to a frequency band that encompasses all unstable frequencies. By limiting the bandwidth of the feedback cancellation signal, the distortion due to the adaptive filter is minimized and limited only to the unstable feedback regions. A relatively simple signal processing algorithm is used to produce highly effective results with minimal signal distortion.

15 Claims, 20 Drawing Sheets

U.S. PATENT DOCUMENTS

2004/0125966 A1 7/2004 Weidner

FOREIGN PATENT DOCUMENTS

| GB | 2 274 372 | 7/1994 |
|---|---|---|
| WO | WO96/35314 | 11/1996 |

OTHER PUBLICATIONS

Bustamante, et al., "Measurement and Adaptive Suppression of Acoustic Feedback in Hearing Aids," IEEE Publication, pp. 2017-2020.1989.

Dyrlund, et al., Acoustic Feedback Margin Improvements in Hearing Instruments Using a Prototype DFS (Digital Feedback Suppression) System, Scand. Audio. 20, pp. 49-53, 1991.

Egolf, et al., "The Hearing aid Feedback Path: Mathematical Simulations and Experimental Verification," J. Acoust. Soc. Am. 78 (5), pp. 1578-1587, Nov. 1985.

Egolf, et al., "Simulating the Open-Loop Transfer Function as a Means for Understanding Acoustic Feedback in Hearing Aids," J. Acoust. Soc. Am. 85 (1), pp. 454-467, Jan. 1989.

Engebretson, et al., "Adaptive Feedback Stabilization of Hearing Aids," Scand. Audiol. Suppl. 38, pp. 56-64, 1993.

Engebretson, et al., "Properties of an Adaptive Feedback Equalization Algorithm," J. Rehab. Res. and Dev., Dept. of Vet. Affairs, vol. 30, No. 1, 1993, pp. 8-16.

Estermann, et al., "Feedback Cancellation in Hearing Aids: Results from Using Frequency-Domain Adaptive Filters," Inst. for Signal and Info. Processing, pp. 257-260, 1994.

Joson, et al., "Adaptive Feedback Cancellation with Frequency Compression for Hearing Aids," J. Acoust. Soc. Am., 94 (6), pp. 3248-3254, Dec. 1993.

Kates, James M., "Feedback Cancellation in Hearing Aids: Results From a Computer Simulation," IEEE Trans. on Signal Processing, vol. 39, No. 3, pp. 553-562, Mar. 1991.

Maxwell et al., "Reducing Acoustic Feedback in Hearing Aids," IEEE Transactions on Signal Processing, vol. 3, No. 4, pp. 304-315, Jul. 1995.

Wang et al., "Acoustic Feedback Cancellation in Hearing Aids," IEEE Publication, pp. 137-140, 1993.

BAND-LIMITED ADAPTIVE FEEDBACK CANCELLER FOR HEARING AIDS

This is a continuation of application Ser. No. 09/409,163 filed Sep. 30, 1999 now U.S. Pat. No. 6,876,751.

RELATED APPLICATION

This application claims the benefit of co-pending provisional application Ser. No. 60/102,557 filed Sep. 30, 1998.

BACKGROUND OF THE INVENTION

1. Field of the Invention

The present invention relates generally to the field of audio amplification, especially for hearing aids. More particularly, the invention provides a method for efficiently cancelling acoustic feedback in the hearing aid.

2. Prior Art

Acoustic feedback in a hearing aid, from the electroacoustic transducer (commonly referred to as the "receiver") back to the microphone, is common and difficult to suppress. Feedback may produce an audible whistle, which is irritating to the hearing aid wearer so that the wearer must often reduce the volume to a lower than desired level, thereby reducing the effectiveness of the hearing aid.

One reason that it is difficult to effectively suppress acoustic feedback in a hearing aid is that the frequency at which feedback occurs varies with changing external conditions. Therefore, for feedback to be effectively cancelled without undesirably degrading the amplified signal, some form of adaptive cancellation is required. Various techniques have been proposed for implementing adaptive feedback cancellation. Such techniques are disclosed, for example, in U.S. Pat. Nos. 5,016,280; 5,091,952 and 5,259,033.

One of the principal design objectives for hearing aids is miniaturization of physical volume. Most wearers prefer a hearing aid that can be worn entirely within the ear. Advances in microelectronics have vastly improved the signal processing capabilities of in-the-ear (ITE) hearing aids. Even so, the provision of effective feedback cancellation remains a practical design challenge. Prior art techniques necessarily require certain trade-offs. As a result of such trade-offs, the hearing aid may exhibit only a small increase in maximum stable gain, slow filter adaptation, distortion, interference and/or lack of adaptation to individual wearers.

SUMMARY OF THE INVENTION

The present invention provides an improved method for adaptively cancelling acoustic feedback in hearing aids and other audio amplification devices. Feedback cancellation is limited to a frequency band that encompasses all unstable frequencies. By limiting feedback cancellation in this manner, a relatively simple signal processing algorithm may be used to produce highly effective results with minimal signal distortion.

In order to implement the present invention, unstable feedback frequencies must first be identified. This is accomplished by various techniques with real ear measurements, from which the complex open loop transfer function may be derived. Once the unstable feedback frequencies are identified, a band limited adaptive filter is implemented. By thus limiting the bandwidth of adaptation, the adaptive feedback canceller is able to adapt very quickly within the range of unstable frequencies with relatively low adaptation noise.

By limiting the bandwidth of the feedback cancellation signal, the distortion due to the adaptive filter is minimized and limited only to the unstable feedback regions. Compared to broadband feedback cancellation, the band limited feedback canceller of the present invention produces less distortion, and therefore the output sound quality is much improved.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

Figure 1:
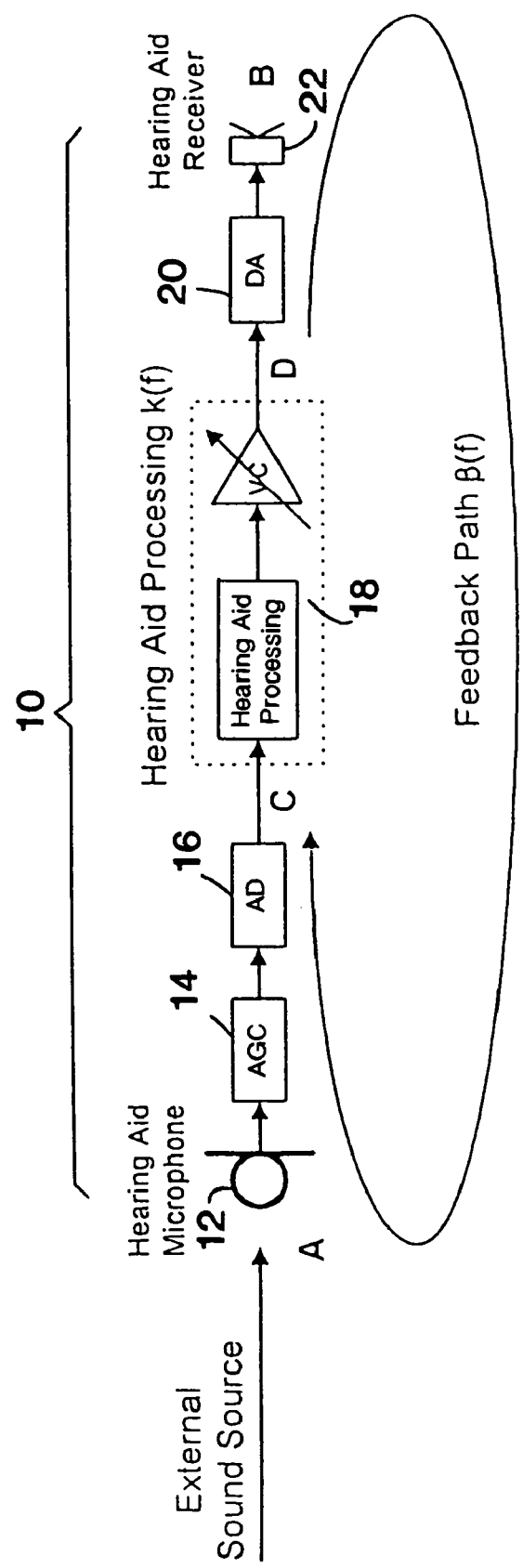
FIG. 1 is a functional block diagram of a hearing aid in which the present invention may be implemented.

FIG. 1 is a functional block diagram of a hearing aid 10 in an ear of a hearing aid user. The hearing aid 10 comprises a microphone 12, microphone pre-amplifier circuitry 14, analog-to-digital converter 16, signal processing circuitry 18, digital-to-analog converter 20 and receiver 22. The signal processing circuitry 18 has a transfer function from point C to point D of K(f). The feedback path from point D to point C includes digital-to-analog converter 20, hearing aid receiver 22, acoustic and mechanical coupling between the receiver and microphone, analog conditioning circuitry 14, and analog-to-digital converter 16. β(f) is the transfer function of the feedback path.

Figure 2:
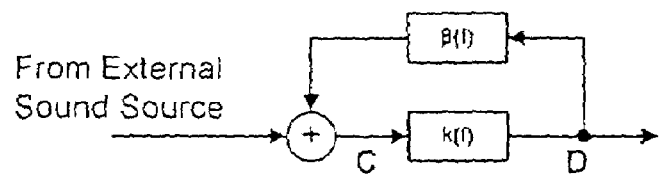
FIG. 2 is a simplified diagram illustrating the transfer functions of the hearing aid of FIG. 1.

FIG. 2 shows a simplified hearing aid model in the ear. The open loop transfer function of the hearing aid is defined as K(f)β(f). A hearing aid may produce unstable feedback only at those frequencies, $f_u$, where its open loop transfer function meet the Nyquist instability criteria:

Magnitude: $|K(f_u) \cdot \beta(f_u)| \geq 1$

Phase: $\angle K(f_u)\beta(f_u) = n \times 360°$   Equation 1

When the above phase condition is met and the magnitude of the hearing aid open loop transfer function is close to but less than unit gain, the hearing aid is in a sub-oscillatory state. Both sub-oscillation and oscillation are unpleasant to hearing aid wearers and must be eliminated. In the following description, We refer both unstable feedback frequency and sub-oscillatory frequency as unstable feedback frequency. An efficient feedback cancellation algorithm needs to operate only in the frequency region containing all $f_u$. We have found that when feedback cancellation is limited to this frequency region, a relatively simple algorithm can produce highly effective results with minimal signal distortion. None of the previously developed methods of feedback cancellation in hearing aid systems has exploited this discovery.

Figure 3:
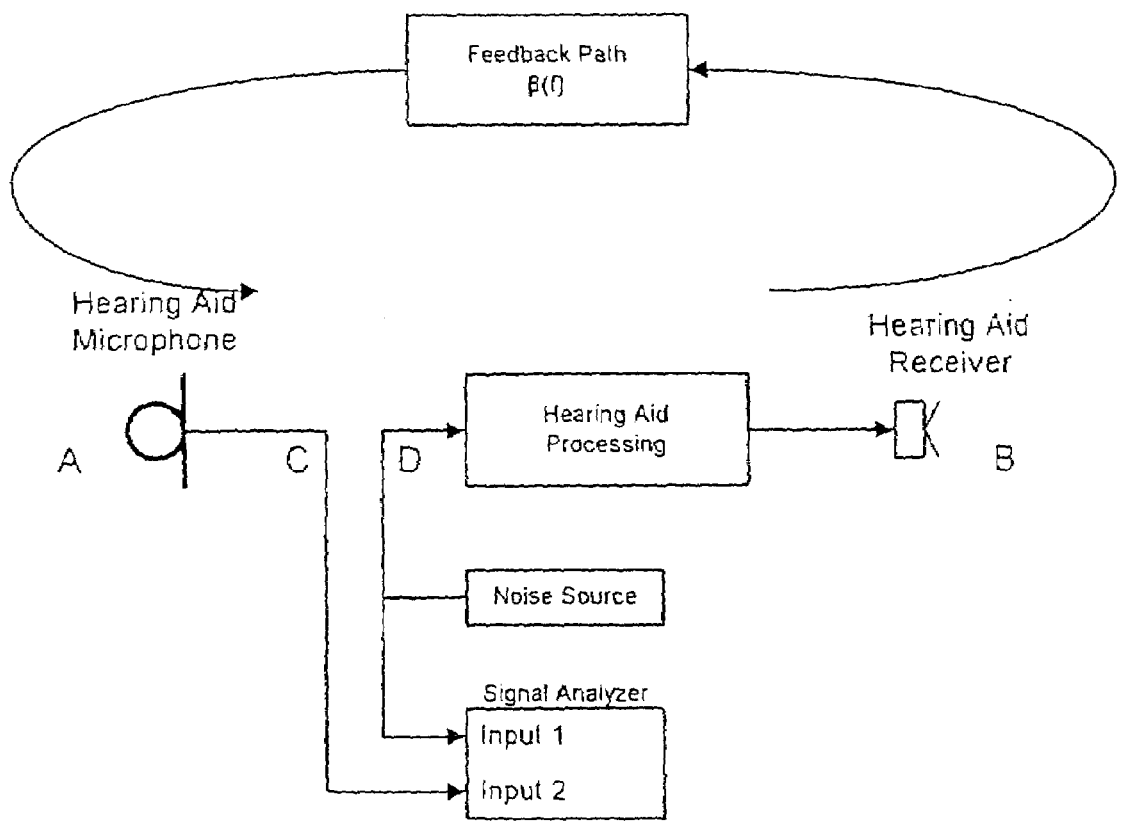
FIG. 3 illustrates a prior art technique for deriving the open loop transfer function of a hearing aid.

To derive the open loop transfer function, conventional prior art methods break the closed loop system after the microphone pre-amplifier and before the hearing aid processing module, as shown between points C and D in FIG. 3, and make a standard two-channel transfer function measurement with a signal analyzer. However, these methods cannot be conveniently used with commercial hearing aids, because it is impractical to break the hearing aid circuit. We have developed the following three methods to derive the open loop transfer function without breaking the hearing aid circuit.

The first method utilizes a probe microphone to accurately derive the open loop transfer function K(f)β(f) from a closed loop measurement by acquiring the probe microphone signals near the eardrum with the hearing aid in the ear canal. This method is described in co-owned patent application Ser. No. 08/926,320, the specification of which is incorporated herein by reference. Briefly, the method requires acquiring probe microphone signals near the eardrum to compute the open loop transfer function with the hearing aid in three gain settings, G1, G2, and G3, where G3=0 (i.e., the hearing aid is off). The method and procedure of detecting and digitizing the acoustic signal with a probe microphone used in the current invention are, in part, the subjects of co-owned U.S. Pat. No. 5,325,436, "Method of Signal Processing for Maintaining Directional Hearing with Hearing Aids".

The complex open loop transfer function K(f)β(f) can be derived as:

$$K(f)\beta(f) = \frac{G1 \times H_{2AB}(f) - G2 \times H_{1AB}(f) + H_{3AB}(f) \times (G2 - G1)}{G2 \times G1 \times [H_{2AB}(f) - H_{1AB}(f)]}$$   Equation 2 where $H_{1AB}(f)$, $H_{2AB}(f)$ and $H_{3AB}(f)$ are closed loop transfer functions from point A to point B in FIG. 1 measured with G1, G2 and G3. Point A is at the hearing aid microphone input and point B is at the hearing aid receiver output, i.e., at the probe microphone.

Because the probe microphone must be used for the closed loop measurements, the venting system of the hearing aid is partially blocked by the probe tube. The derived open loop transfer function is thus only an approximation of the open loop transfer function with an open hearing aid vent. The closed loop transfer function measurements are also sensitive to head movement and surrounding environmental changes during the measurements.

Figure 4:
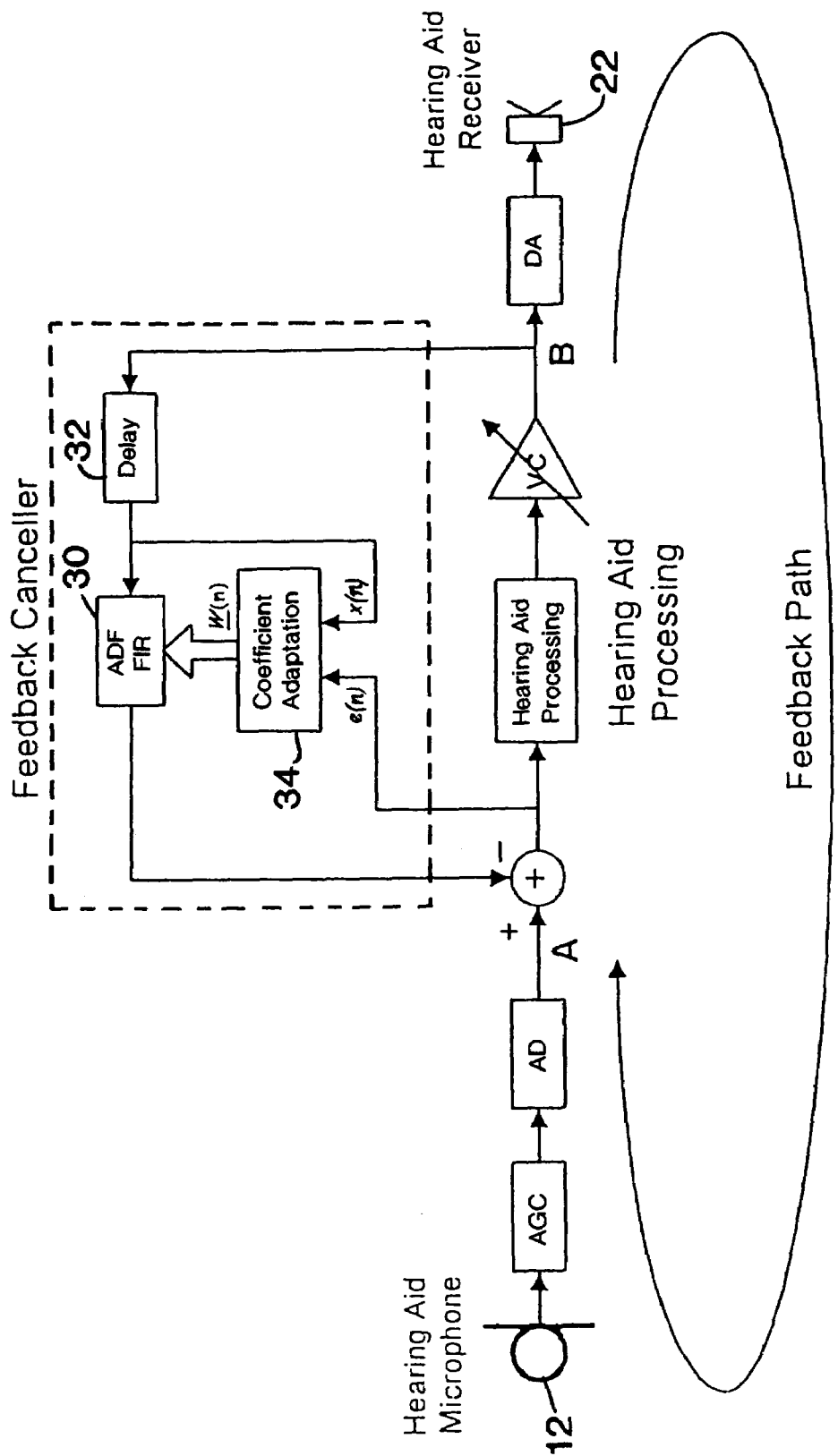
FIG. 4 is a functional block diagram of a hearing aid which incorporates a generic broadband adaptive feedback canceller.

The second method does not require a probe microphone measurement. It requires configuring the adaptive feedback canceller in the hearing aid to operate in a broadband mode as shown in FIG. 4. The adaptive digital filter (ADF) 30 in the hearing aid provides an estimation of the feedback path including the digital-to-analog converter 20, the receiver 22, the coupling path between the receiver and microphone, the microphone 12, the AGC 14, and the analog-to-digital converter 16.

Data is collected with the hearing aid wearer seated in a quiet room. A white noise signal is generated in the sound field through a loudspeaker. The hearing aid is programmed with a known reference response. The hearing aid wearer is instructed to adjust the hearing aid gain below the Uncomfortable Level (UCL). While the white noise is playing in the sound field, the ADF in the hearing aid adapts itself to match the feedback path. After the ADF has converged, the filter coefficient vector $\underline{W}(n)$ is read from the hearing aid together with the "delay". The feedback transfer function β'(f) can be estimated as follows:

$\beta'(f) = e^{-j2\pi f D} \times W_n(f)$   Equation 3 where D is the delay introduced by "Delay" block 32; $W_n(f)$ is the frequency response of the ADF at time index n, for which the impulse response is $\underline{W}(n)$. To improve the accuracy of the measurement, several coefficient vectors $\underline{W}(n_i)$ with different time index $n_i$, can be obtained from the ADF and averaged to compute $W_n(f)$ in Equation 3.

In order to compensate for the hearing loss of each individual, the hearing aid reference response used during the measurement is replaced by a desired hearing aid response K(f). The complex open loop transfer function associated with the desired hearing aid response K(f) can be estimated by K(f)β'(f):

$K(f)\beta'(f) = e^{-j2\pi f D} \times W_n(f) \times K(f)$   Equation 4

The unstable feedback frequencies can then be determined by the estimated open loop transfer function based on Equation 1. Comparing with the first method, this method does not require a probe microphone measurement. Therefore, the venting system of the hearing aid is not blocked during the measurement. The measurement is not sensitive to head movement and surrounding environmental changes. It does not require additional circuitry in the hearing aid to support the measurement. The white noise signal serves as a test signal for the measurement, but it also acts as interference noise to the ADF since the signal directly from the loudspeaker does not carry any information about the feedback path. Thus, it introduces adaptation noise to the ADF coefficients. To achieve the best results, the level of the white noise signal should be kept as low as possible but above the noise floor of the room. The hearing aid gain should be set as high as possible but below UCL and without audible feedback. Furthermore, the hearing aid is configured in a closed-loop during the measurement. The unstable feedback rather than the UCL may be the limiting factor for setting the hearing aid gain.

Figure 5:
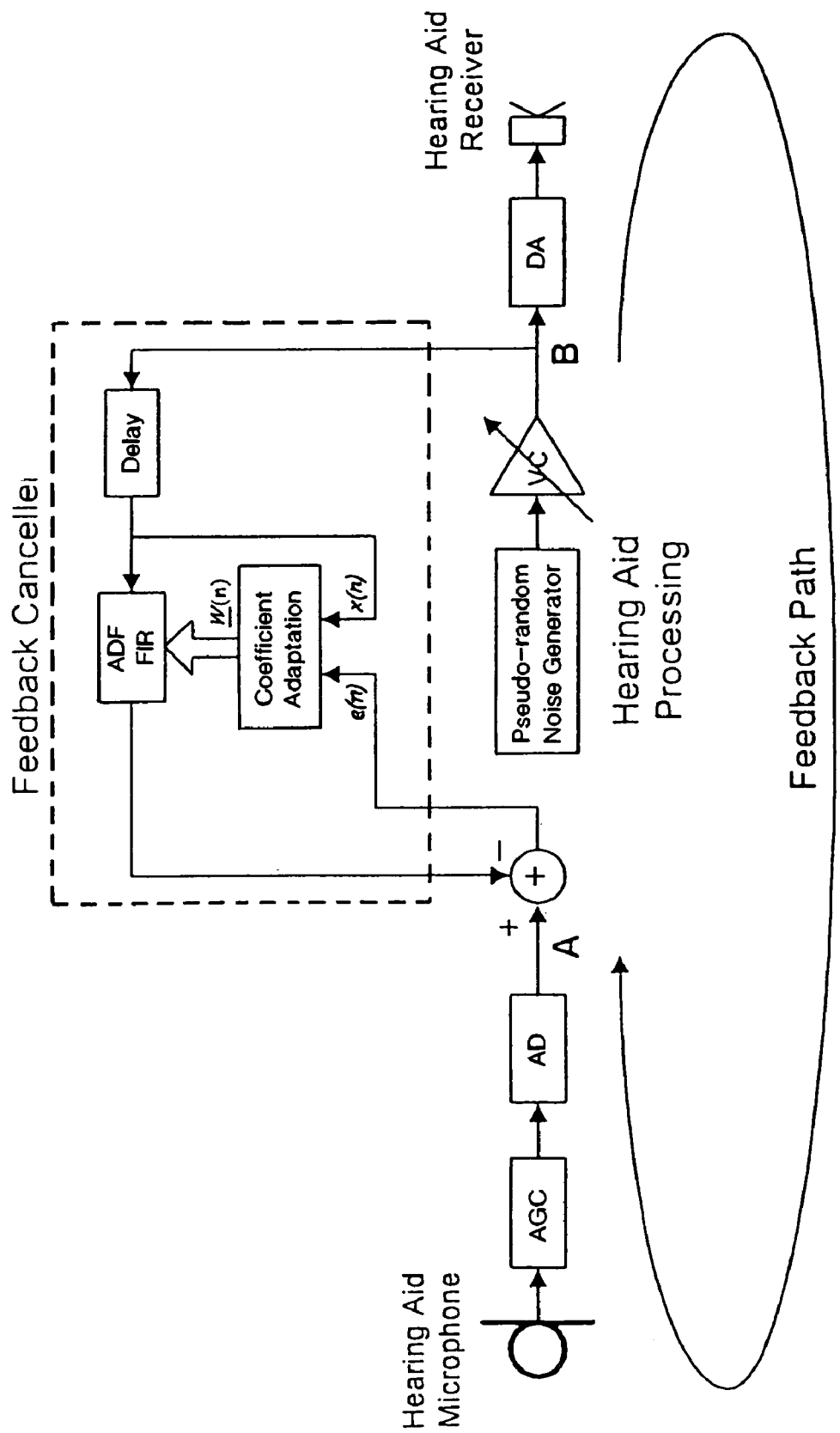
FIG. 5 is a functional block diagram of a hearing aid having an internal noise generator for derivation of the open loop transfer function.

The third method is similar to the second method discussed above. An internal pseudo-random noise generator as shown in FIG. 5 is used to replace the external white noise test signal, and the hearing aid processing block is disconnected. This method has two advantages over the second method discussed above: (1) the adaptation interference introduced by the external test signal is removed by using an internal pseudo-random noise generator; and (2) the hearing aid is operated in an open-loop configuration during the measurement. Thus, the hearing aid gain can be set as high as possible without instability problems. This method requires adding a noise generator and some control logic to the hearing aid. The open loop transfer function measurement is only required during the initial fitting process.

FIGS. 4 and 5 both illustrate a generic broadband adaptive feedback canceller. A digital feedback cancellation signal is generated by passing the hearing aid digital output signal at point B to an ADF 30, which approximates the feedback path β(f). The digital feedback cancellation signal is subtracted from the digitized microphone output at point C, eliminating the feedback signal from the hearing aid.

The ADF 30 comprises an adjustable filter, which uses filter coefficients to generate a feedback cancellation signal. A coefficient adaptation portion 34 adjusts the filter coefficients to approximate the feedback path. There are various adaptive filtering methods, which have different filtering structures and different adaptation algorithms. Some of them exhibit extremely good convergence behavior and accuracy, but require extensive computation. For example, the family of Least-Squares (LS) algorithms belongs to this category. For the application of adaptive feedback cancellation to hearing aids, the simple Stochastic-Gradient (SG) algorithms are sufficient to provide acceptable performance. The simplicity of the adaptive filtering algorithm is a very important factor for hearing aid applications since it is desirable to minimize the hardware requirements. We choose an FIR (Finite-Impulse-Response) filter with Normalized Least-Mean-Square (LMS) algorithm for the ADF coefficient adaptation because of its simplicity and satisfactory convergence performance. To make the adaptive filtering algorithm more specifically suitable for the problem of adaptive feedback cancellation in hearing aids, we adopted a Normalized LMS algorithm with the adaptation step-size normalized to ADF input and error, as discussed below.

In general, the adaptive filter is a time-varying system, which can track the time-varying feedback paths. But unnecessary variations due to the adaptation noise of the adaptive filter may also introduce unpleasant distortion in the hearing aid output. Thus, the adjustment of the adaptive filter should be minimized except as necessary for eliminating the unstable feedback.

The signals coming from external sound sources (external input signals), other than the signals which are fed back from the hearing aid output to the hearing aid microphone, are usually considered as an interference to the adaptation of the adaptive filter. An external input signal normally introduces bias to the optimal solution for the adaptive filter. The bias varies when the external input signal's property changes. The external input signal also causes misadjustment noise during the adaptation process. By removing the frequency components that are unlikely to have potential oscillation problems (unstable and sub-oscillatory) from the adaptation signals: e(n) and x(n), which are used for the adaptation process, the interference effects of the external input signal on the adaptation process can be greatly reduced.

For the modified Normalized LMS algorithm, the convergence speed of the adaptive filter is governed by the adaptation step-size, which is inversely proportional to the combined signal power of e(n) and x(n). Reducing the combined signal power would lead to a larger adaptation step-size, which in return increases the convergence speed. Since we are removing the components that are irrelevant to the oscillation problems from the adaptation signals, the combined signal power of e(n) and x(n) is reduced so that a larger adaptation step-size may be used to increase the convergence speed. With a higher convergence speed, the feedback canceller can better track the dynamic feedback path and the sudden gain change of AGC due to a sharp transition of input signal.

Furthermore, due to the recursive topology used in the adaptive feedback cancellation, the periodicity in the external input signal would cause the cancellation of original signal (external input signal) at the hearing aid output. By removing the frequency components that are irrelevant to the oscillation problems from the adaptation signals, the periodicity in the adaptation signals, which originates from the external input signal, can be reduced. Therefore, the problem of canceling the original input signal at the hearing aid output will be relieved.

In addition, the adaptive filter always functions better at frequencies where large energy exists. This means that the adaptive feedback canceller actively works at oscillation frequencies only when the energy of the oscillation components existing in the adaptive filter input signal and the error signal is comparable or greater than the peak energy of the spectrum of external input signal. As a result, the magnitudes of the frequency components at unstable feedback frequencies are build up and then suppressed, up and down, around the levels of the external input spectral peaks. This is so-called modulation effect of residual oscillation components.

By removing the unnecessary frequency components from the adaptation signals, the peak spectral level is much reduced. Therefore, the magnitudes of the residual oscillation components are also significantly reduced.

This concept of removing unnecessary frequency components from the adaptation signals is extremely important and beneficial when the external input signal is a speech signal. As is well known, speech contains most of its energy and periodicity at the low frequencies, at which unstable feedback is unlikely to occur. Therefore, the low frequency components of speech are considered unnecessary for the adaptive filtering and can be easily removed by applying a highpass (or bandpass) filter to the adaptation signals. The cutoff frequency of the highpass filter is normally set at 200 Hz below the lowest unstable feedback frequency.

As indicated above, the unstable feedback only occurs at certain frequencies. To effectively suppress oscillation at these frequencies without introducing distortion at other frequencies, the current invention configures the adaptive feedback canceller in such a way that it limits the bandwidth of adaptation signals to the frequency regions known to contain the oscillation frequencies. By doing so, the adaptive feedback canceller adapts very quickly in the oscillation frequency regions with much less adaptation noise and adapts very slowly in other regions. As a result, the feedback cancellation signal generated by the ADF is also limited to the same frequency regions. Therefore, unlike the broadband scheme, the band-limited feedback canceller produces less distortion, and hence the output sound quality is much improved.

Figure 6:
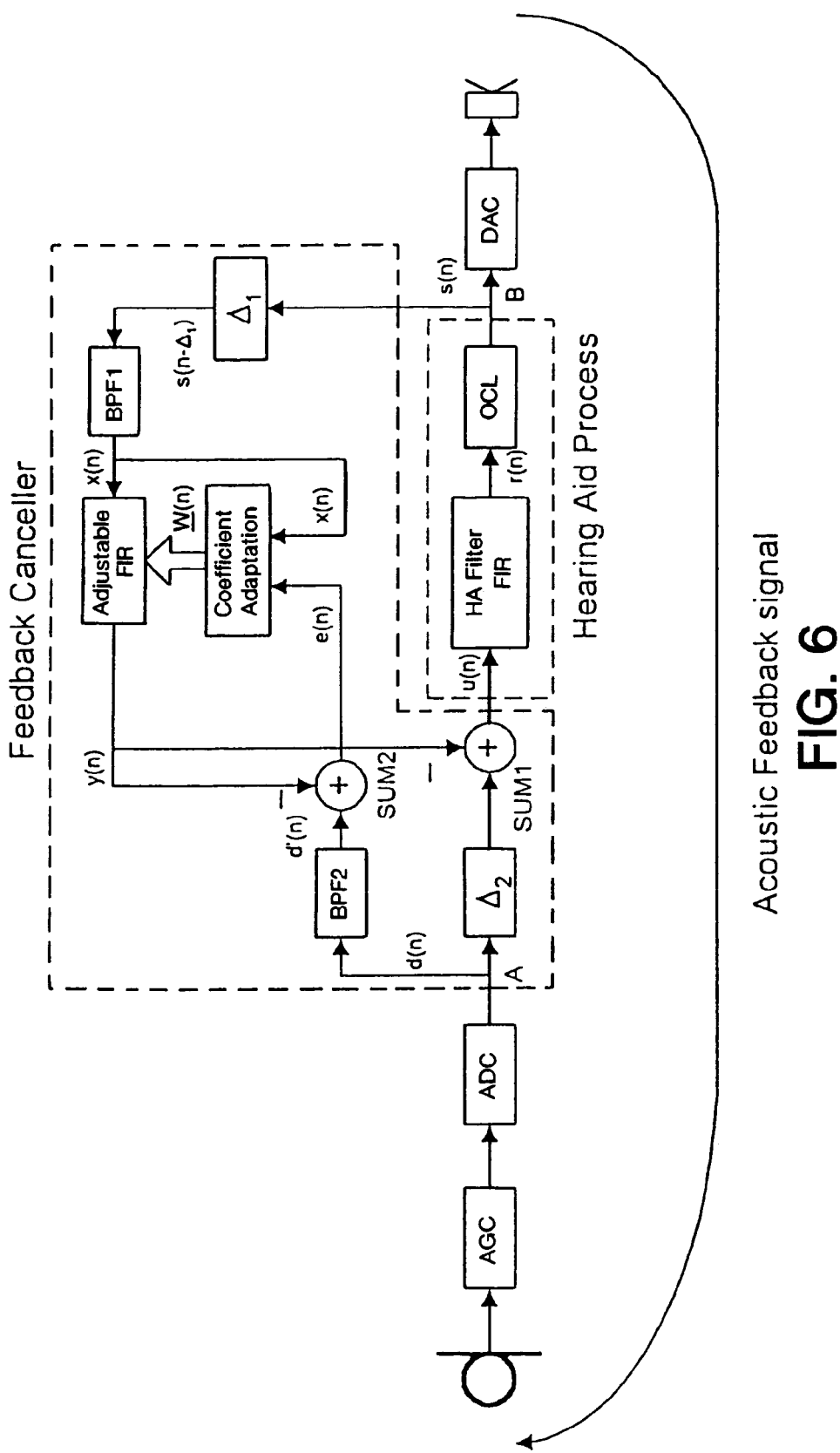
FIG. 6 is a functional block diagram of one embodiment of a hearing aid having a band-limited adaptive feedback canceller in accordance with the present invention.

FIG. 6 shows one possible structure to implement the band-limited adaptive feedback canceller. BPF1 and BPF2 are bandpass filters, which only pass the frequency region containing all the unstable feedback frequencies. BPF1 and BPF2 remove most of the unnecessary frequency components from e(n) and x(n) to improve the adaptation process. The hearing aid input signal is filtered by BPF2 and then used as the desired signal for the adaptive filtering so that the adaptive filter only generates the cancellation signal in the passband of BPF2. A $\Delta_2$-delay linear-phase FIR filter is selected as the bandpass filter BPF2 so that we can use a pure delay $\Delta_2$ to ensure the unfiltered hearing aid input $d(n-\Delta_2)$ is properly time-aligned with the filtered desired signal d'(n) at the cancellation junction SUM2 without introducing phase distortion in the primary hearing aid signal path. Since the additional delay $\Delta_2$ in the primary hearing aid signal path may increase the number of oscillation frequencies and shift the oscillation frequency to a lower frequency, the filter length of BPF2 must be minimized. The $\Delta_1$-sample delay in front of filter BPF1 is used to ensure the feedback cancellation signal is properly time-aligned with the feedback signal so that the impulse response of the adaptive filter contains most of the energy of the estimated impulse response of the feedback path. On the other hand, the delay introduced by the filter BPF1 must not be too long or the cancellation signal generated by the adaptive filter may lag behind the feedback signal. The group delays introduced by each block must meet the following condition:

$$D_{\Delta_1}(f)+D_{BPF1}(f)+D_{ADF\_FIR}(f)=D_{feedback\ path}(f)+D_{BPF2}(f) \quad \text{Equation 5}$$

The optimal delay $\Delta_1$ in samples can be determined based on the measurement of the feedback path during the hearing aid fitting process. In order to utilize all the ADF coefficients, the delay caused by the adaptive filter should be minimized. The delay $\Delta_1$ must meet the following condition:

$$D_{\Delta_1}(f) \leq D_{feedback\ path}(f)+D_{BPF2}(f)-D_{BPF1}(f) \quad \text{Equation 6}$$

We choose:

$$\Delta_1 = \min\{D_{feedback\ path}(f)+D_{BPF2}(f)-D_{BPF1}(f)\}_{f \in passband} - \epsilon \quad \text{Equation 7}$$

Where $\epsilon$ is the tolerance in samples. We typically choose $\epsilon$ equal to 2.

The output of the ADF is calculated one sample at time. At time index n, the calculation for the M-tap ADF output is described as:

$$y(n) = \sum_{k=0}^{M-1} w_k(n) \cdot x(n-k) \quad \text{Equation 8}$$

where $\{w_0(n), w_1(n), \ldots, w_{M-1}(n)\}$ are the coefficients of the M-tap ADF at time index n.

The coefficients of the ADF are updated with a modified Normalized LMS algorithm. As in the conventional Normalized LMS algorithm, the adaptation step-size is reduced when the signal level is high and vice versa. In feedback cancellation for hearing aids, however, the input signal of the ADF is delayed by the hearing aid processing module, BPF1 and $\Delta_1$. The power of the error signal e(n) is included for calculating the time-varying step-size as follows:

$$e(n)=d'(n)-y(n), \text{ where } d'(n) \text{ is the output of the bandpass filter BPF2.} \quad \text{Equation 9}$$

$$p(n)=\rho \cdot p(n-1)+x^2(n)+e^2(n) \quad \text{Equation 10}$$

$$\mu(n) = \frac{C}{[(1-\rho) \cdot p(n) + ME] \cdot M} \quad \text{Equation 11}$$

where $\rho$ is the forgetting factor;

C is a constant to control the adaptation speed; and

ME is a small number to prevent the singularity of $\mu(n)$.

The coefficients of the ADF for the next time index n+1 are updated as follows:

$$w_k(n+1)=w_k(n)+\mu(n) \cdot e(n) \cdot x(n-k), \text{ for } 0 \leq k \leq M-1 \quad \text{Equation 12}$$

Due to the bandpass characteristics of BPF1 and BPF2, the adaptation signals e(n) and x(n) only contain the frequency components in the oscillation frequency regions.

Figure 7:
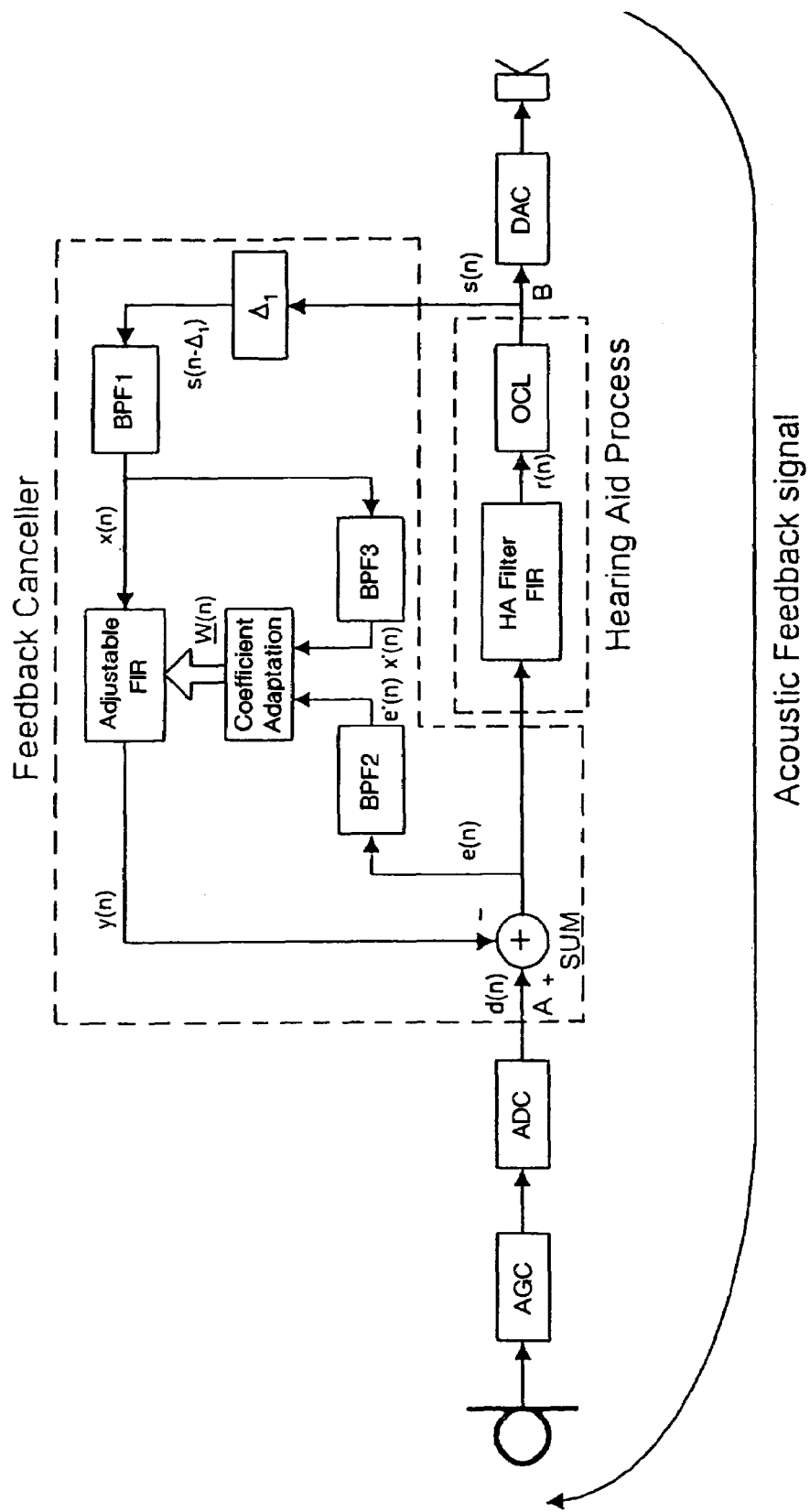
FIG. 7 is a functional block diagram of another embodiment of a hearing aid having a band-limited adaptive feedback canceller in accordance with the present invention.

FIG. 7 shows another possible structure for implementing an adaptive band-limited feedback canceller. BPF1 is mainly used to limit the bandwidth of the cancellation signal and to limit cancellation artifacts to the cancellation bandwidth. BPF2 and BPF3 are used to limit the bandwidth of the adaptation signals to the oscillation frequency regions. BPF1, BPF2 and BPF3 are not necessarily implemented as linear-phase FIR filters, but their passbands must cover all the oscillation frequencies.

The filtered adaptation signal samples are used for updating the time-varying step-size and ADF coefficients as follows:

$$p(n)=\rho \cdot p(n-1)+x'^2(n)+e'^2(n) \quad \text{Equation 13}$$

$$\mu(n) = \frac{C}{[(1-\rho) \cdot p(n) + ME] \cdot M} \quad \text{Equation 14}$$

$$w_k(n+1)=w_k(n)+\mu(n) \cdot e'(n) \cdot x'(n-k), \text{ for } 0 \leq k \leq M-1 \quad \text{Equation 15}$$

where x' (n) is the output of the bandpass filter BPF3; and e' (n) is the output of the bandpass filter BPF2.

To make the adaptive system stable, the phase responses of BPF2 and BPF3 must be as close as possible. For simplicity and better adaptation, we select two identical high pass filters for BPF2 and BPF3. Unlike what is required for bandpass filter in Structure 1, the passband ripples of BPF1, BPF2, and BPF3 are not critical for good performance as long as the stopband attenuation is sufficient. In our experience, 30 dB stopband attenuation is adequate. Therefore, low-order IIR filters such as $2^{nd}$ or $3^{rd}$ order Elliptic IIR filters may be used for this application to reduce the hardware and computation complexity.

In contrast to the embodiment illustrated in FIG. 6, the various group delays in FIG. 7 must meet the following condition:

$$D_{\Delta_1}(f) + D_{BPF1}(f) + D_{ADF\_FIR}(f) = D_{DAC}(f) + D_{acoustic\ feedback\ path}(f) + D_{ADC}(f) \quad \text{Equation 16}$$

The optimal delay $\Delta_1$ in samples can be obtained in the measurement of the feedback path during the hearing aid fitting processing. In order to utilize all the ADF coefficients, the delay caused by the adaptive filter should be minimized. The delay $\Delta_1$ must meet the following condition:

$$D_{\Delta_1}(f) \leq D_{DAC}(f) + D_{acoustic\ feedback\ path}(f) + D_{ADC}(f) - D_{BPF1}(f) \quad \text{Equation 17}$$

We choose:

$$\Delta_1 = \min\{D_{DAC}(f) + D_{acoustic\ feedback\ path}(f) + D_{ADC}(f) - D_{BPF1}(f)\}_{f \in passband} - \epsilon \quad \text{Equation 18}$$

Where $\epsilon$ is the tolerance in samples. We typically choose E equal to 2.

This band-limited feedback cancellation structure does not introduce any additional delay in the primary signal path and does not introduce additional phase distortion to the hearing aid output.

Figure 21:
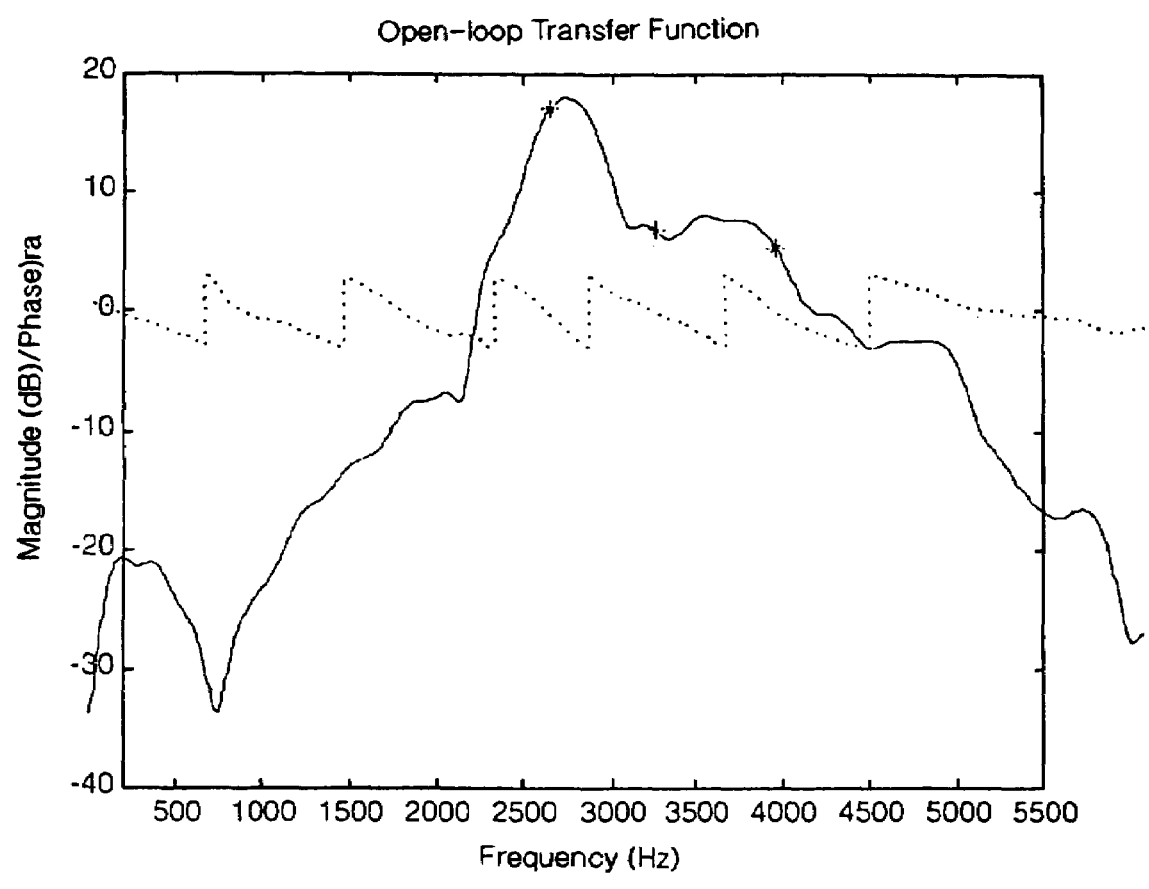
FIG. 21 is an example of open loop transfer function and unstable feedback frequencies measured on KEMAR ear.

The purpose of the ADF is to estimate the feedback path. In FIG. 7, BPF1 is used to limit the bandwidth of the feedback cancellation signal. Because the frequency response of the feedback path has band-pass characteristics as generally shown in FIG. 21, we may use BPF1 to approximately match the frequency response of the feedback path. In this way, the ADF can be used mainly to track the variation of the feedback path.

The band-limited adaptive feedback canceller can be implemented on a platform with either a general-purpose digital signal processor or a specialized digital signal processor. Due to the size and power constraints of hearing aid circuit design, it is desirable to utilize a fixed-point digital signal processor with limited precision and word length as the adaptive feedback canceller. Thus, the efficient digital realization of the band-limited adaptive feedback canceller is extremely critical for the performance of the feedback cancellation under the constraint of limited hardware and computational resources. The present invention simplifies the computational requirements and addresses issues associated with the limited-precision effects on the adaptation process.

Figure 9:
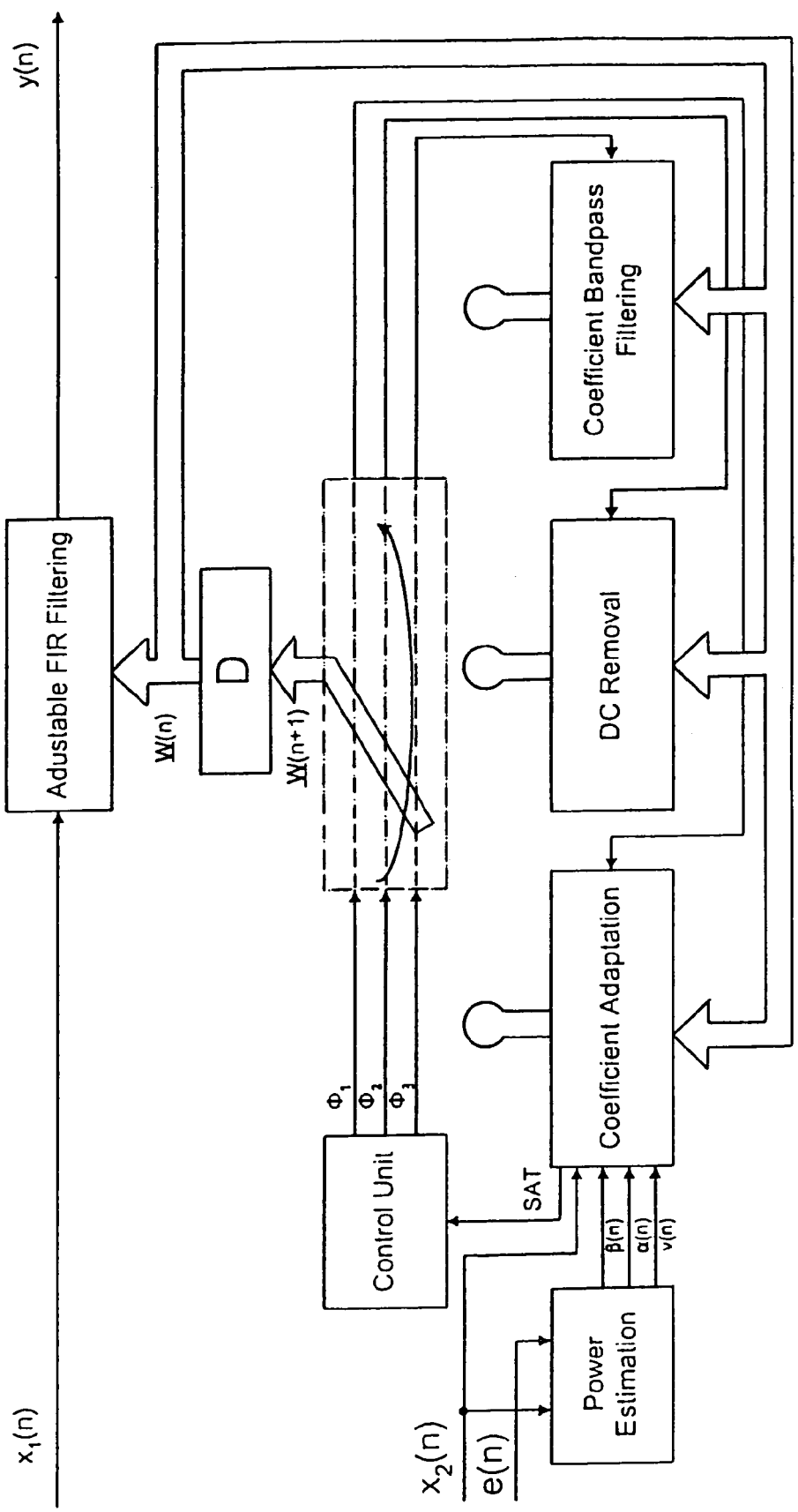
FIG. 9 is a functional block diagram illustrating the signal processing used to implement an adaptive digital filter.

In both of the above-described structures of band-limited feedback cancellers, the operations of adaptive filtering are performed in the same way. For a fixed-point implementation, some additional modules are required to maintain efficiency of calculation under the limited precision constraint. A generalized structure for adaptively filtered, band-limited feedback cancellers is shown in FIG. 9. This generalized structure is applicable for both of the above-described embodiments. There are three input ports ($x_1(n)$, $x_2(n)$, and $e(n)$) and one output port ($y(n)$) for this adaptive filtering configuration.

For the feedback canceller structure shown in FIG. 6:

$$x_1(n) = x_2(n) = x(n)$$

For the feedback canceller structure shown in FIG. 7:

$$x_1(n) = x(n)$$

$$x_2(n) = x'(n)$$

$$e(n) = e'(n)$$

The generalized structure contains an adjustable FIR filtering module, a power estimation module, a coefficient adaptation module, a DC removing module, a coefficient bandpass filtering (CBF) module and a control unit. The purposes and detailed implementation of these modules is described below:

1. Adjustable FIR Filtering

The adaptive FIR filter is used to approximate the dynamic feedback path and generate a feedback cancellation signal by convolving the input signal $x_1(n)$ with current filter coefficients $\{W_k(n): 0 \leq k \leq M-1\}$. However, the feedback path response has a very large dynamic range. In the fixed-point implementation, to fully make use of the internal precision of fixed-point adaptive FIR filtering, we must maximize the ADF coefficients to fit the word-precision allocated to them. An ADF scaling gain (G) is used to maximize the ADF coefficients and provide a wide dynamic range for the feedback cancellation signal. Therefore, the calculation of the M-tap adaptive FIR filter output is slightly modified as:

$$y(n) = G \cdot \sum_{k=0}^{M-1} w_k(n) \cdot x_1(n-k) \quad \text{Equation 19}$$

Figure 20:
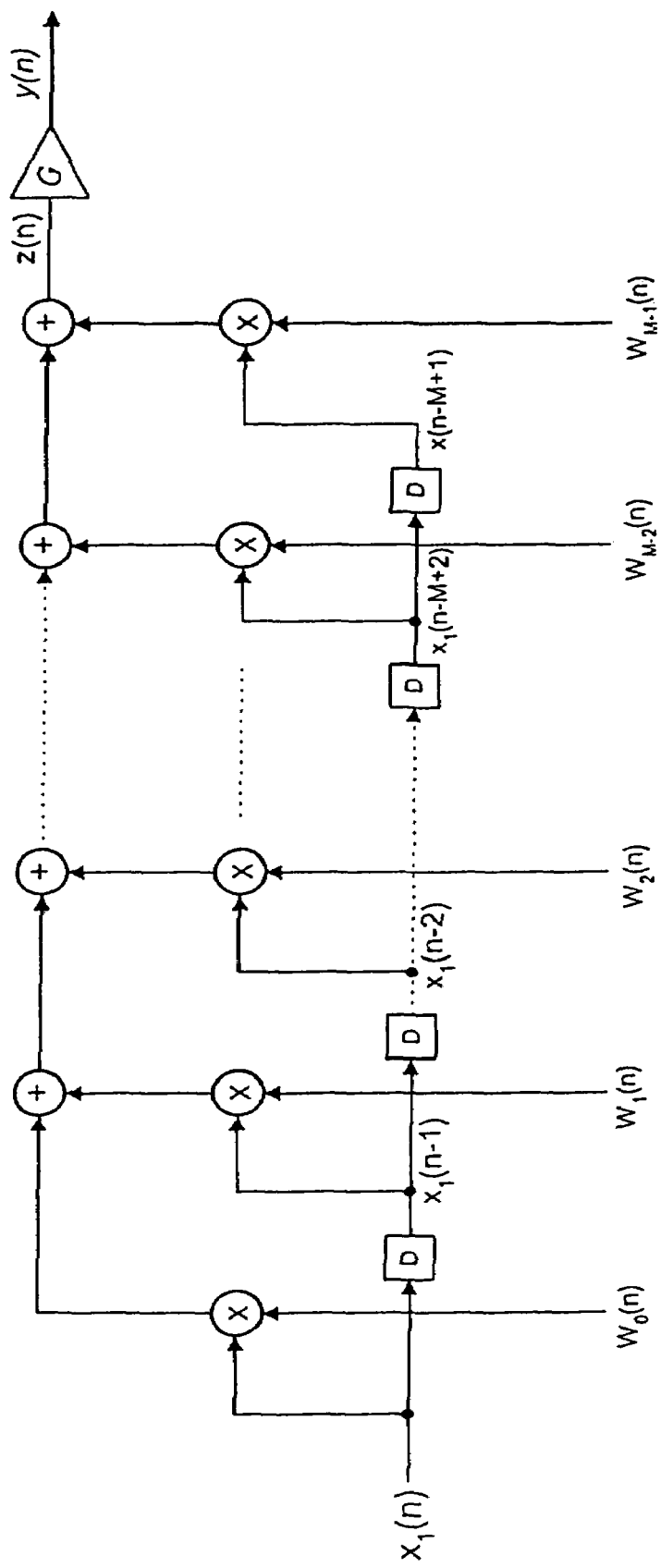
FIG. 20 is a functional block diagram of adjustable FIR filtering with a power-of-two scaling gain.

The scaling gain G is selected as a power-of-two number $2^L$ and can be implemented by left/right shifting. Normally, it is sufficient for L to be in the range $[-3, 3]$, which provides a dynamic range from $-18$ dB to $18$ dB. FIG. 20 shows a functional block diagram of adjustable FIR filtering with a power-of-two scaling gain.

2. Coefficient Adaptation

With the ADF scaling gain included, the calculation for time-varying step-size has to be modified as:

$$\mu(n) = \frac{C}{G \cdot [(1-\rho) \cdot p(n) + ME] \cdot M} \quad \text{Equation 20}$$

As shown in Equation 10 and Equation 13, $p(n)$ is the power estimation of the combined signal $e(n)$ and $x_2(n)$. In the fixed-point implementation, because of the word-truncation in calculating $\rho \cdot p(n-1)$, limit cycles will prevent $p(n)$ from becoming zero, and therefore ME in Equation 20 is not necessary. For simplicity, we set ME to 0.

In order to avoid the division in calculation of time-varying step-size, we use a power-of-two number to approximate $p(n)$ and select C, $(1-\rho)$, G, and M as power-of-two numbers:

$C = 2^{-K}$ $(1-\rho) = 2^{-J}$ $G = 2^L$ $M = 2^F$

Equation 20 can then be rewritten as:

$$\mu(n) \approx \frac{2^{-K}}{2^L \cdot 2^{-J} \cdot 2^{Q[\log_2(p(n))]} \cdot 2^F} \quad \text{Equation 21}$$

$$= 2^{J-K-L-F-Q[\log_2(p(n))]}$$

K is a positive integer to control the adaptation speed. The range of K is typically from 7 to 10. The smaller value of K provides faster adaptation speed. J is a positive integer to control the time-constant of power estimation. Typically, we choose 6 for J. L is an integer to control the ADF scaling gain. As stated above, the range is from −3 to +3. L is determined based on the feedback measurement during the hearing aid fitting process so that the filter coefficients of adaptive filter are maximized. F is an integer related to the length of the adaptive filter. With a sampling rate of 16000 Hz, we choose F=5 (32 taps) so that the duration of the adaptive filter impulse response is about 2 ms, which is long enough to cover the variation of group delay in the feedback path in the unstable feedback frequency regions.

Q[ ] is a truncation operation. $Q[\log_2(p(n))]$ can be implemented by searching the position index of the most significant bit (MSB) of $p(n)$.

Figure 8:
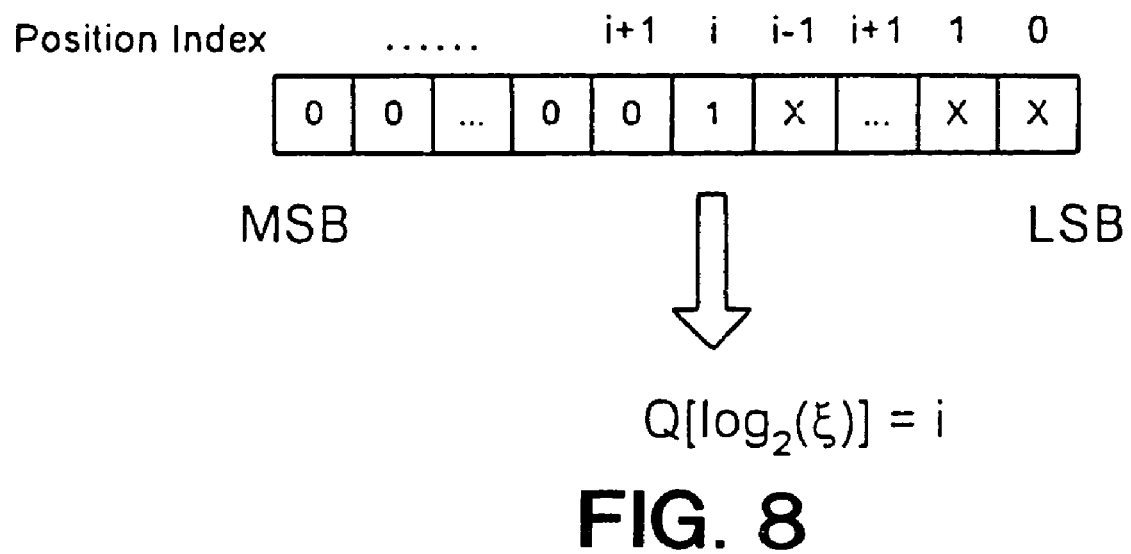
FIG. 8 illustrates base-2 logarithm quantization as used by the present invention for filter coefficient adaptation.

FIG. 8 shows a functional block diagram of base-2 logarithm quantization. $\xi$ is a positive quantity represented in an unsigned binary integer format. The position index of the least significant bit (LSB) is 0. $Q(\log_2(\xi))$ returns the position index of the MSB of $\xi$. When $\xi$ is 0, $Q[\log_2(\xi)]$ returns 0.

We can further simplify the power estimation and coefficient adaptation by using a power-of-two number to approximate the error signal. This quantization of error signal does not affect the performance of the adaptive filter. Thus, the power estimation becomes:

$$p(n) = (1-\rho) \cdot p(n-1) + x_2^2(n) + e^2(n)$$
$$\approx p(n-1) - 2^{-J} \cdot p(n-1) + x_2^2(n) +$$
$$\text{sign}(e(n)) \cdot 2^{Q[\log_2(|e(n)|)]} \cdot e(n)$$

Equation 22

The coefficient adaptation becomes:

$$w_k(n+1) = w_k(n) + \mu(n) \cdot e(n) \cdot x_2(n-k),$$

for $0 \leq k \leq M-1$ $$\approx w_k(n) + 2^{J-K-L-F-Q[\log_2(p(n))]} \cdot \text{sign}(e(n)) \cdot$$
$$2^{Q[\log_2(|e(n)|)]} \cdot x_2(n-k)$$
$$= w_k(n) + \text{sign}(e(n)) \cdot$$
$$2^{J-K-L-F-Q[\log_2(p(n))]+Q[\log_2(|e(n)|)]} \cdot$$
$$x_2(n-k)$$

Equation 23

Equation 22 shows that only one multiplication is required for the power estimation. The coefficient adaptation process shown in Equation 23 becomes a multiplication-free process and can be implemented with shifting, negation and addition operations.

Figure 10:
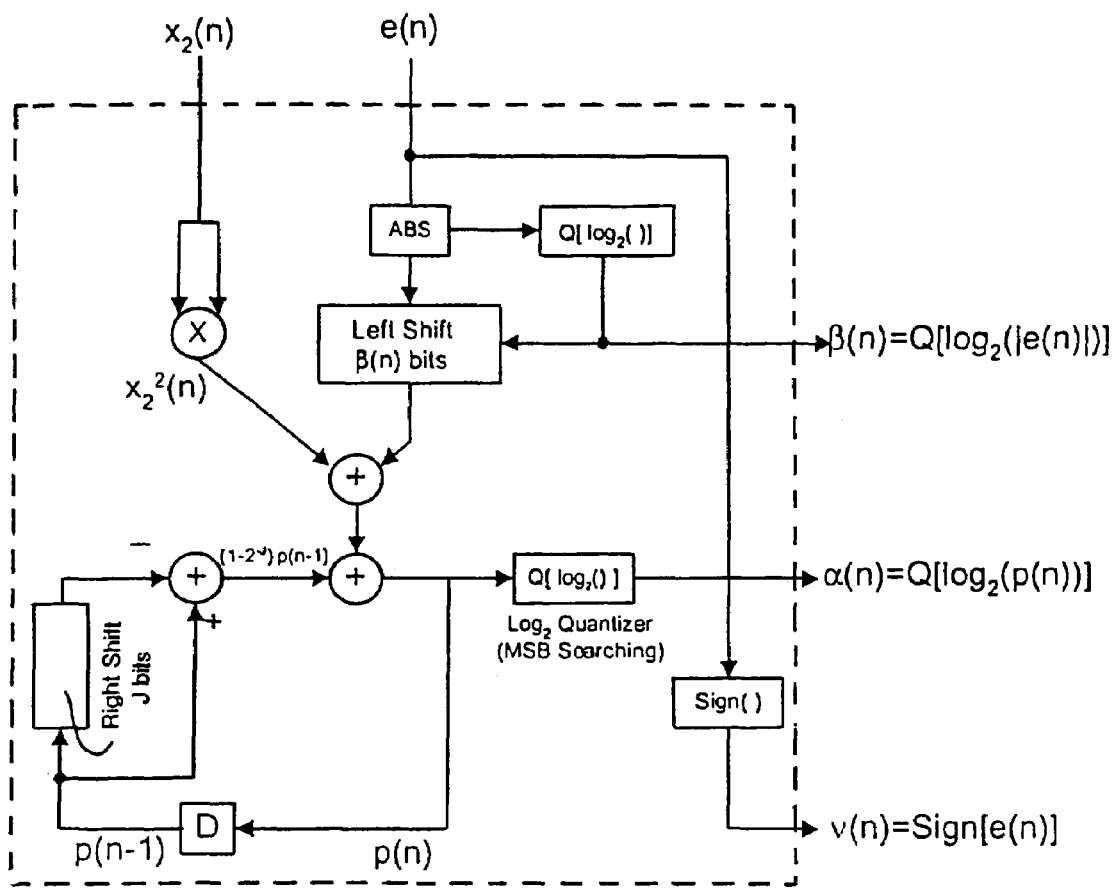
FIG. 10 illustrates the processing used for power estimation.
Figure 11:
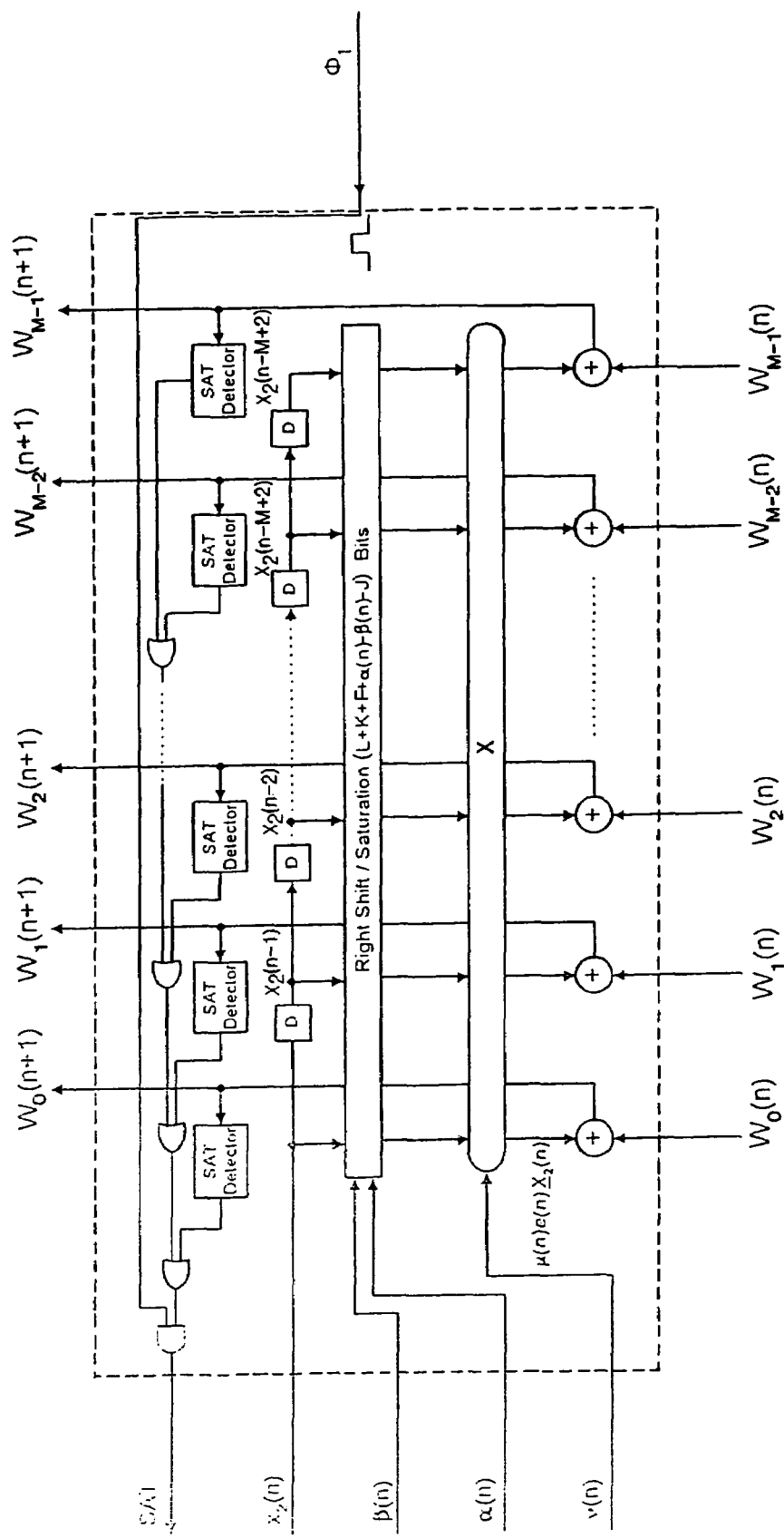
FIG. 11 illustrates the processing used for coefficient adaptation.

FIG. 10 shows the functional block diagram for power estimation, and FIG. 11 shows the functional block diagram for a multiplication-free coefficient adaptation process in which:

$\beta(n)$ is the base-2 logarithm quantization of the error signal $e(n)$;

$\alpha(n)$ is the base-2 logarithm quantization of the power estimation $p(n)$; and $v(n)$ is the sign of the error signal $e(n)$.

Since the band-limited feedback canceller works so efficiently and effectively in the unstable frequency regions, the adaptation step size used for the Normalized LMS adaptive filter may be further reduced to minimize the misadjustment noise and hence improve the hearing aid sound quality. With fixed-point implementation, the normalized LMS adaptation with a very small step size may be simplified to a sign LMS adaptation. Equation 23 may be rewritten as:

$$w_k(n+1)=w_k(n)+\mu\text{sign}(e(n) \cdot x_2(n-k)), \text{ for } 0 \leq k \leq M-1 \quad \text{Equation 23a}$$

Where $\mu$ is a constant. For example, we may choose $\mu$ equal to 1 when $w_k(n)$ is represented with a 12-bit integer. By doing so, the computations associated with power estimation, MSB search, and shifting that are required for the Normalized LMS are eliminated.

3. Limited-Precision Effects Due to Fixed-Point Implementation

In the fixed-point implementation of the adaptive-filtering algorithm, both the inputs and internal algorithmic quantities must be quantized to a certain limited precision. These quantization errors may accumulate without bound until overflow occurs, resulting in unacceptable performance. For example, a slight DC offset in $e(n)$ and $x_2(n)$, which results from either the original ADC output or the word-truncation of band-limiting filtering, may accumulate over time and cause an increase of DC offset in the adaptive filter coefficients. The truncation operations in the adaptive filter coefficient adaptation may also cause similar DC build-up in the adaptive filter coefficients, especially when the signal level is low. Furthermore, the low frequency gain of the ADF filter response may gradually build up if the chosen band-limiting filter BPF1 has excessive low frequency attenuation compared to the feedback path. In both cases, the adaptive filter coefficients may overflow or saturate. A DC removing module is included to periodically remove the DC offset from the adaptive filter coefficient. Another bandpass filtering module is provided to filter the adaptive filter coefficients in order to suppress the low frequency and high frequency response build-up in the adaptive filter response. This operation is only needed when the filter coefficient is saturated.

In the DC removing module, the following operation is implemented to estimate the DC offset in the filter coefficient and subtract the estimated DC offset from the ADF filter coefficients:

$$m(n) = \frac{1}{M} \cdot \sum_{k=0}^{M-1} w_k(n) \quad \text{Equation 24}$$

$$w_k(n+1)=w_k(n)-m(n), \; 0 \leq k \leq M-1 \quad \text{Equation 25}$$

Figure 12:
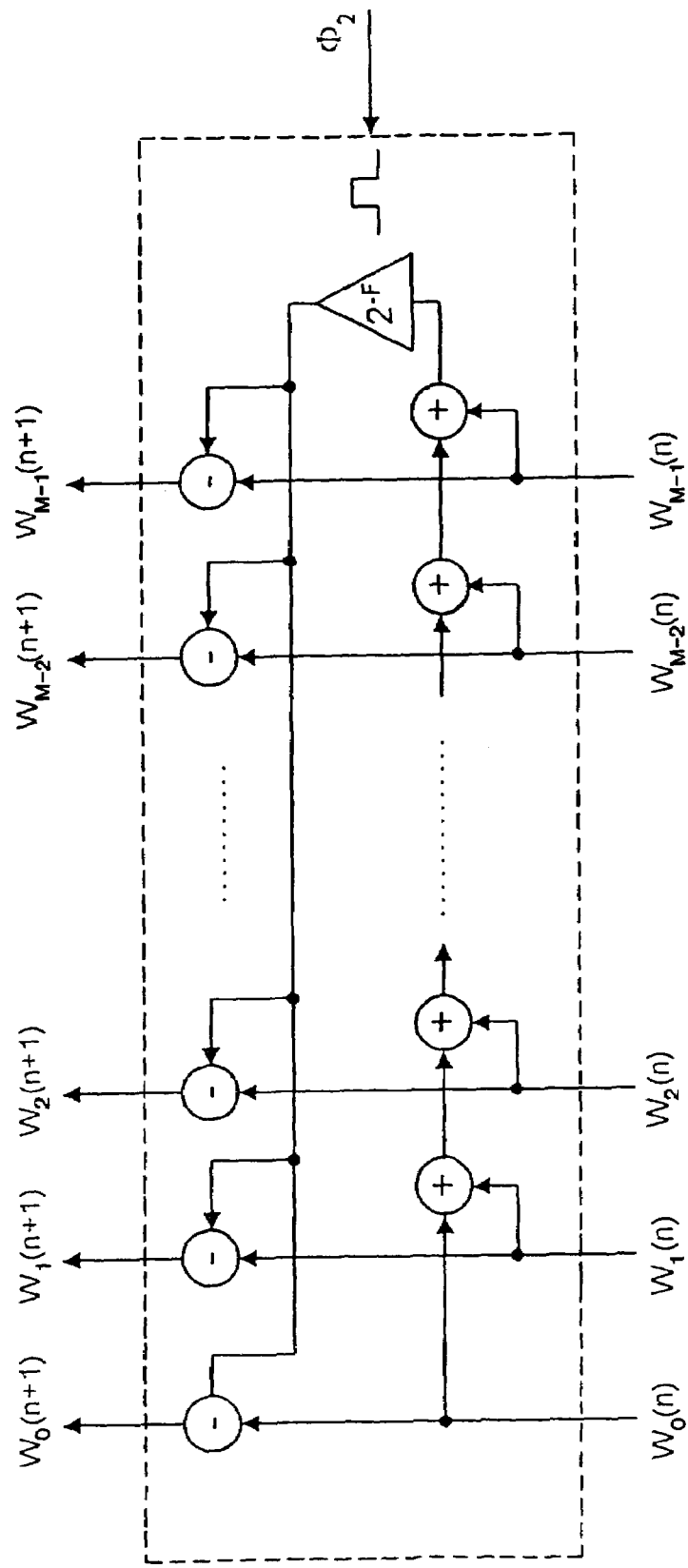
FIG. 12 illustrates the processing used for DC removal.

FIG. 12 illustrates the computational process for DC removal.

For example, the DC removal may be scheduled every 256 samples at 16000 Hz sampling rate.

In the CBF module, a zero-delay bandpass filtering operation on the ADF coefficients is performed as follows:

$$w_k(n+1)=w_k(n)/2-w_{k+1}(n)/2, \; 0 \leq k \leq M-3 \quad \text{Equation 26}$$

$$w_k(n+1)=w_k(n)/2, \; k=M-2, M-1 \quad \text{Equation 27}$$

Figure 13:
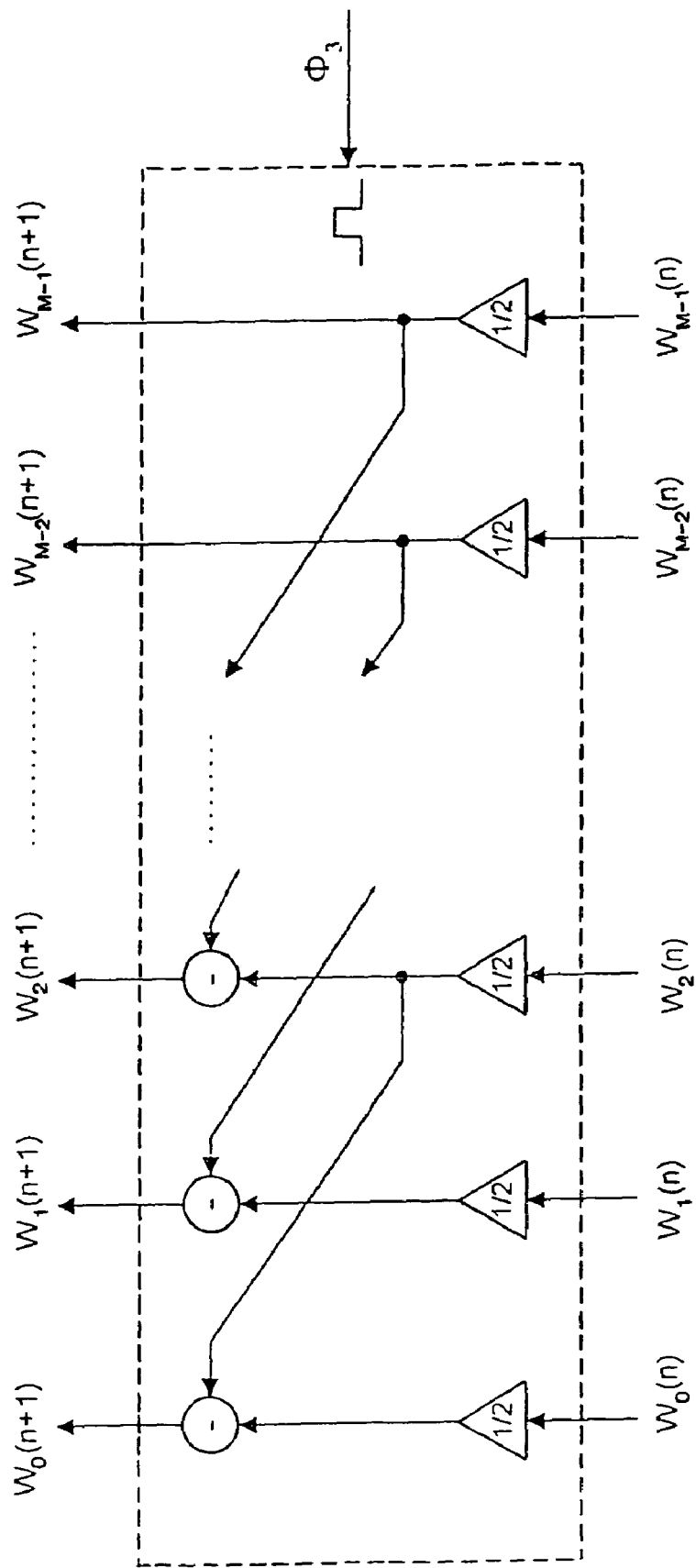
FIG. 13 illustrates the processing used for bandpass filtering.

FIG. 13 illustrates the computational process for bandpass filtering. This simple bandpass filtering operation doesn't offer a perfectly flat 0 dB magnitude response across the passband, and may introduce minor audible distortion at the hearing aid output. It cannot be applied frequently and is only triggered when any one of the ADF coefficients is saturated.

Figure 14:
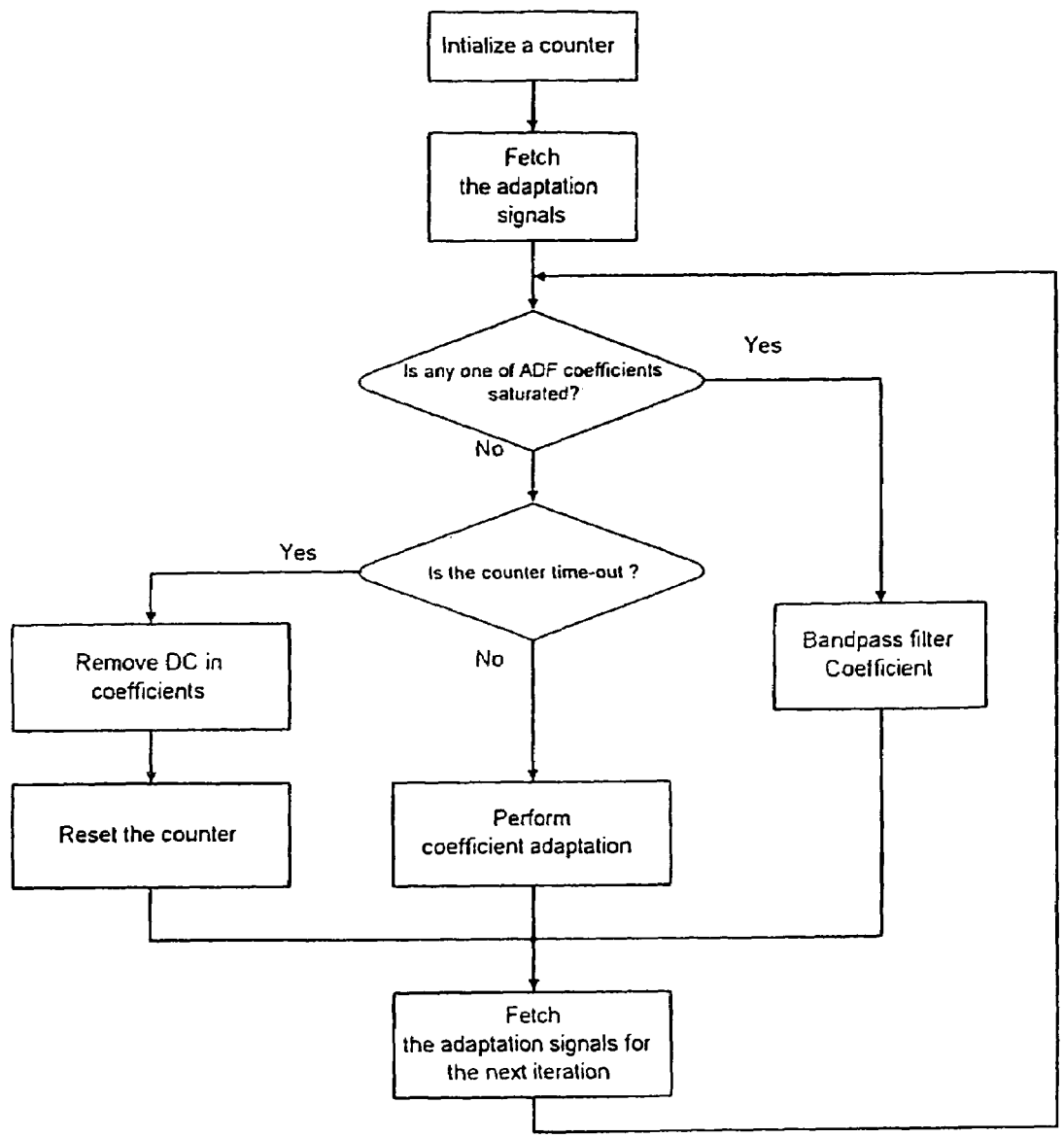
FIG. 14 is a functional flow diagram illustrating the process scheduling implemented by the control unit of FIG. 9.

As mentioned earlier, the adaptive filter coefficient adaptation must be performed in company with DC removing and coefficient bandpass filtering operations. Since the DC removing and coefficient bandpass filtering operations don't need to be performed frequently, we schedule only one of these three operations to be performed at each sample period. FIG. 14 is a flow chart of the scheduling process. In this way, the DC removing operation is performed periodically, and the coefficient bandpass filtering operation is triggered only when the SAT signal from the coefficient adaptation module is on.

Figure 15:
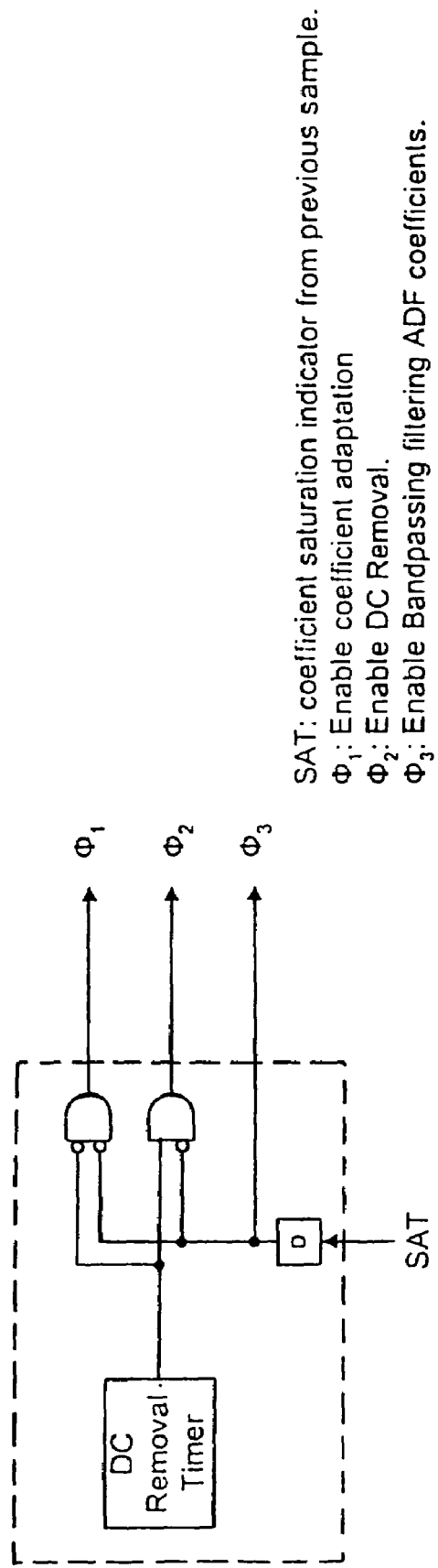
FIG. 15 is a logic diagram corresponding to the flow diagram of FIG. 14.

FIG. 15 is a logical diagram of the control unit, which generates the control signals for the coefficient adaptation module, the DC removal module, and the coefficient bandpass filtering module.

Experimental Results

The first test of this invention was performed with a computer simulation. The simulation model was developed in SIMULINK and built with a dynamic feedback path. The dynamic feedback path was measured on a KEMAR ear with a clipboard slowly moving toward and away from the ear. Various hearing aid responses for human subjects were used as hearing aid processing for the simulation.

The hearing aid response and the dynamic feedback path were used to derive the open loop transfer function and identify the unstable feedback frequencies. The unstable feedback frequencies were used to configure the feedback canceller, specifically the bandwidth of the band-limiting filters. The tests were made with and without the band-limited adaptive feedback canceller. The maximum stable hearing aid gain was recorded under both conditions. The simulated hearing aid outputs were also used for subjective evaluation.

The same tests were performed on human subjects with a real-time prototype digital hearing aid. The open loop transfer function of the hearing aid was determined based on closed loop probe tube measurement. The unstable feedback frequencies were identified from the open loop transfer function and used to configure the band-limited adaptive feedback canceller. The maximum stable insertion gains were recorded with and without the adaptive canceller.

The results have shown that the band-limited feedback canceller effectively eliminates the oscillation and sub-oscillatory feedback and increases the stable hearing aid insertion gain by 12-15 dB with minimum distortion to the sound quality.

FIG. 21 shows an example of open loop transfer function measured on KEMAR ear. There are three unstable feedback frequencies as indicted by cross symbols. They are at 2660 Hz, 3260 Hz, and 3960 Hz. Therefore, the cutoff frequency for the band-limiting filters is set to 2460 Hz, which is about 200 Hz below the lowest unstable feedback frequency.

Alternative Embodiments

The embodiments shown in FIG. 6 and FIG. 7 are two specific examples of band-limited adaptive feedback cancellers. However, the invention embraces other embodiments having the same functionality in terms of limiting the bandwidth of adaptation and bandwidth of the cancellation signal to the frequency regions known to contain oscillation frequencies.

Figure 16:
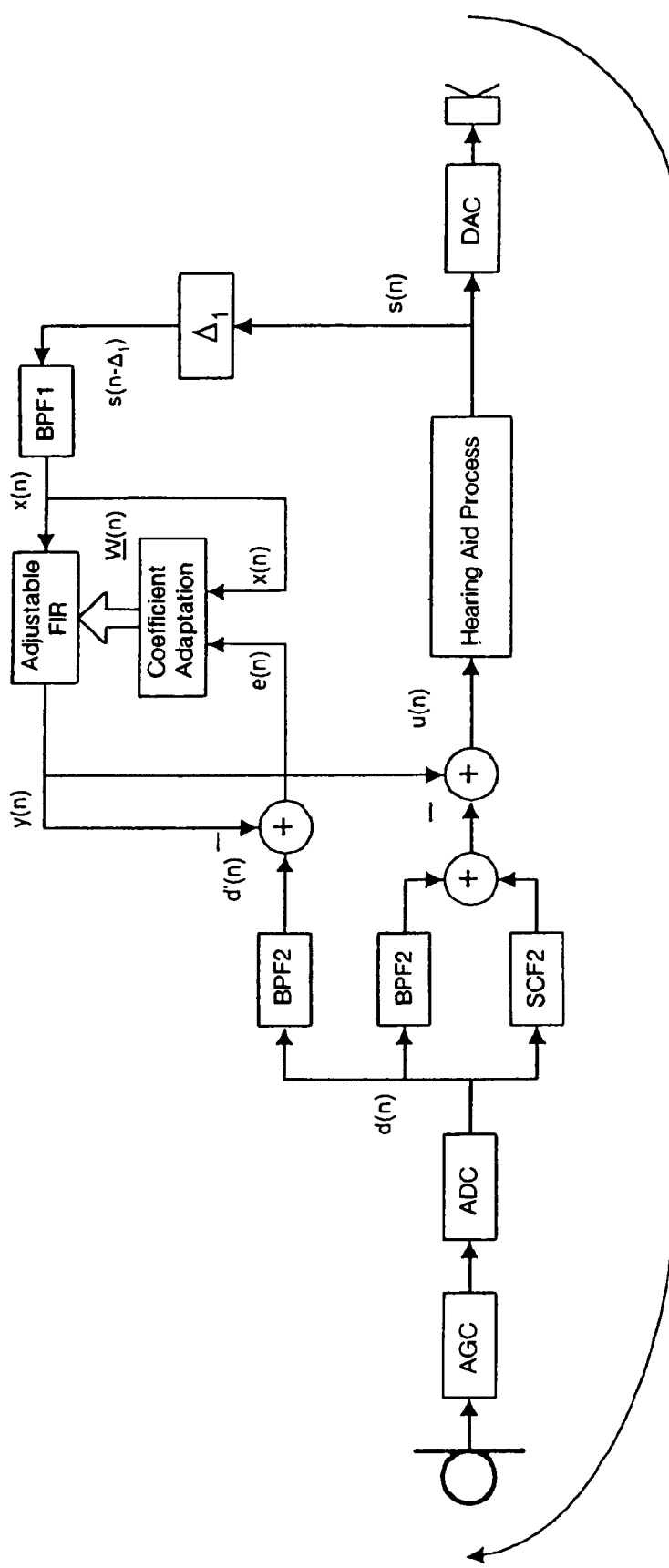
FIG. 16 is a functional block diagram of an alternative embodiment of the present invention.

For example, in FIG. 6, we can replace the $\Delta_2$-sample delay with two strictly complementary filters. One filter would be the same as BPF2, whose frequency transfer function is denoted as $H_2(f)$, and the other would be its strictly complementary filter SCF2, which has a complementary frequency transfer function $e^{-j\Delta_2 2\pi f} - H_2(f)$. Such an embodiment is illustrated in FIG. 16.

Figure 17:
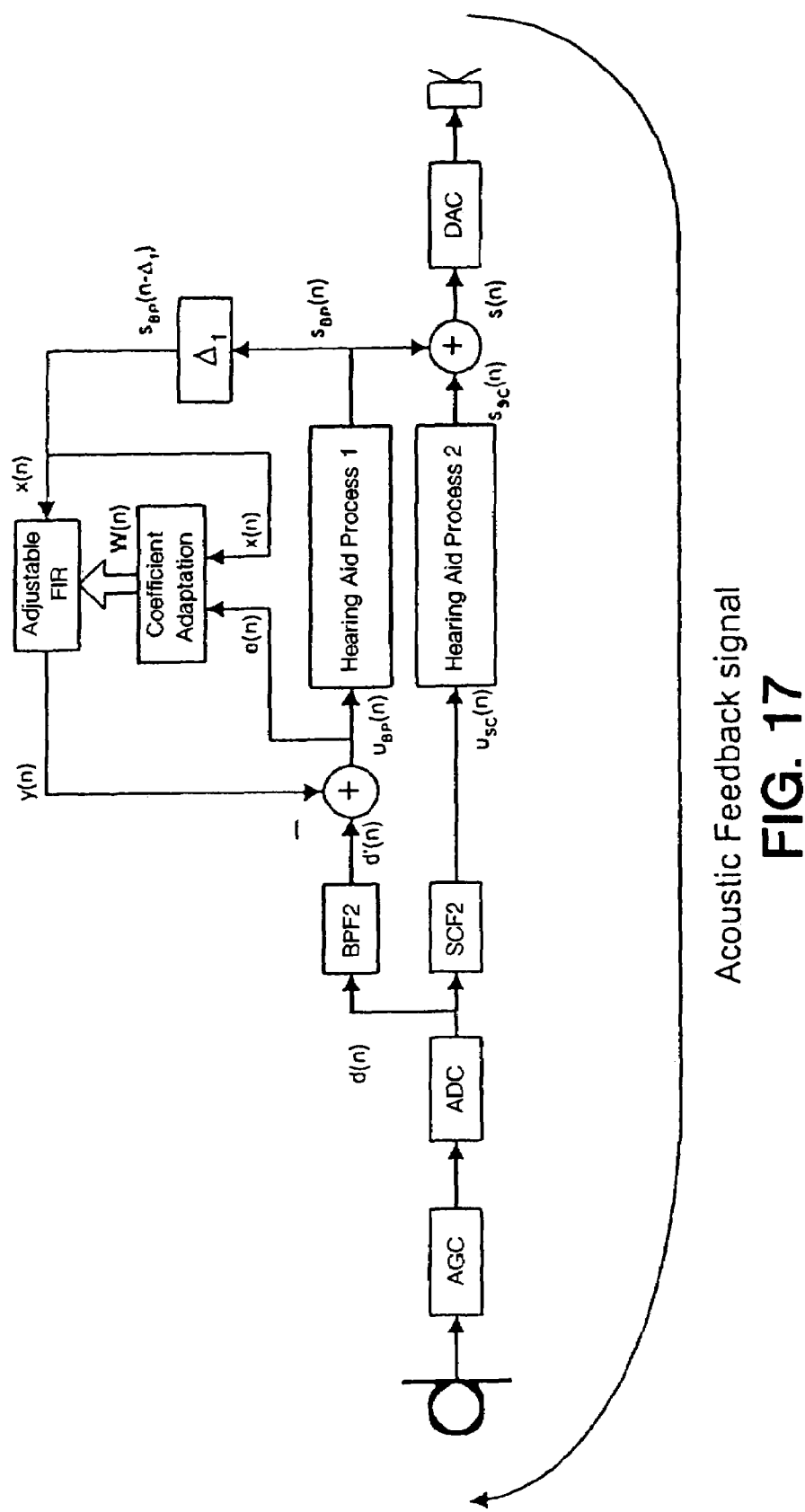
FIG. 17 is a functional block diagram of another alternative embodiment of the present invention.

We can further combine two identical BPF2s and split the hearing aid processing into two processes as shown in FIG. 17. Hearing Aid Process 1 is used to process signals in the frequency regions covered by BPF2, and Hearing Aid Process 2 is used to process the signals produced by BPF2's complementary filter, SCF2. Since the output bandwidth of hearing aid process 1 is the same as BPF2, the need for BPF1 as shown in FIG. 6 is eliminated. A linear-phase FIR filter is selected for BPF2 and its strictly complementary filter is selected for SCF2 in order to minimize phase distortion in the primary signal path of the hearing aid. For some hearing aid applications, the phase distortion in the primary signal path can be either tolerated or corrected by other hearing aid processing modules. In this case, we can relax the strictly complementary condition to other kinds of complementary conditions, e.g., power complementary so that infinite-impulse-response (IIR) filters may be used to replace BPF2 and SCF2 to further reduce the hardware and computational complexity.

Figure 18:
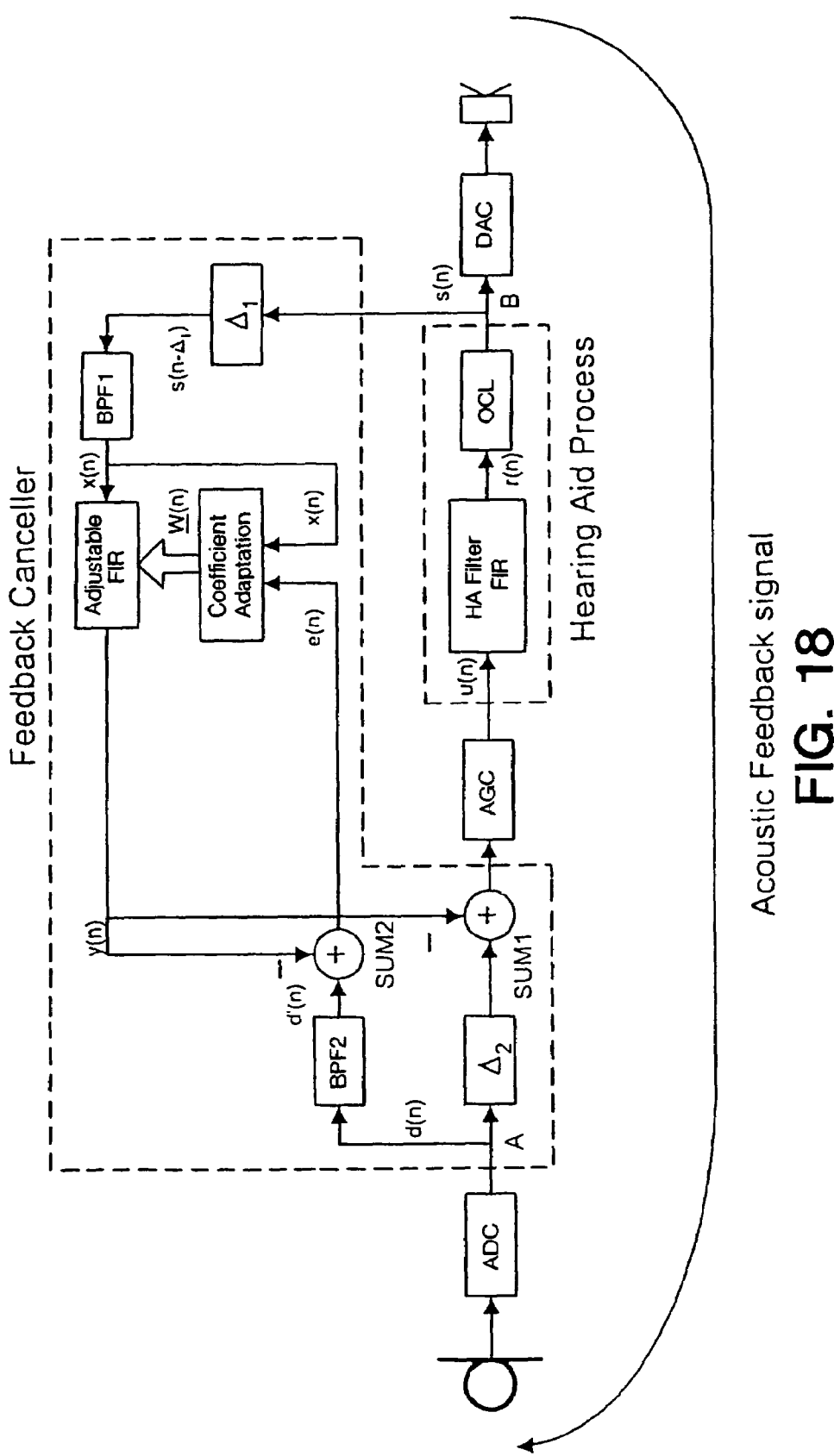
FIG. 18 is a functional block diagram of still another alternative embodiment of the present invention.
Figure 19:
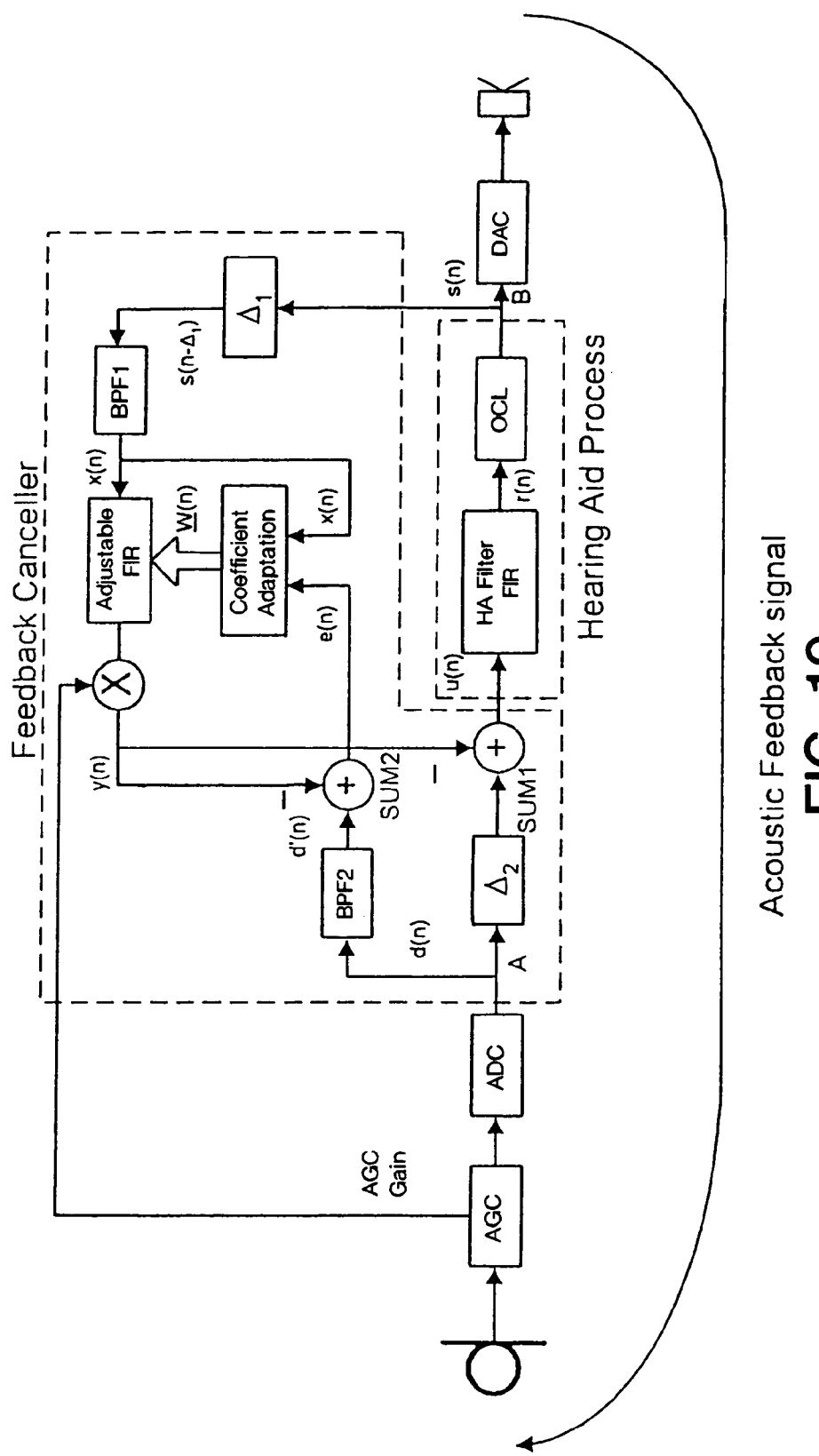
FIG. 19 is a functional block diagram of yet another alternative embodiment of the present invention.

So far, we have assumed that an analog automatic gain control (AGC) is used in the hearing aid between the hearing aid microphone and the analog-to-digital converter. Since the AGC is part of the feedback path but not part of the cancellation signal path, the sudden gain change of AGC due to a sharp transition of the hearing aid input signal may degrade the performance of the cancellation. One alternate construction, as shown in FIG. 18, is to move the AGC after the feedback cancellation junction so that the AGC is in both the feedback path and the cancellation path. This would require a digital implementation of AGC. Another alternate solution, as shown in FIG. 19, is to digitally apply the AGC gain to the feedback cancellation signal so that the feedback cancellation signal tracks the AGC gain change. This method would require converting the AGC gain to a digital format.

The band-limited feedback canceller offers the best sound quality when the cancellation bandwidth is minimized. As is known, the oscillation frequencies of a hearing aid are functions of the hearing aid gain, which is normally controlled by the hearing aid volume control. Thus, the cancellation bandwidth of the feedback canceller can also be controlled by the hearing aid volume control in order to achieve the best sound quality. This can be accomplished by storing several sets of filter coefficients for the band-limiting filter in the hearing aid. With any given hearing aid volume control setting, the appropriate set of filter coefficients is used to provide a filter response that covers all the oscillation frequencies and has the minimum bandwidth. This filter selection process is needed only when the hearing aid wearer changes the volume control setting.

We may also choose different constant K to control the adaptation speed for different hearing aid volume control settings, since the higher hearing aid gain setting may require a faster adaptation speed to suppress the feedback.

It will be recognized that the above-described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A feedback canceller for an audio amplification device having an audio signal path including an amplifier, the feedback canceller comprising:
   an adaptive filter;
   means for setting coefficients of the adaptive filter;
   means for combining an output of the adaptive filter with an input of the audio amplification device;

a first band limiting filter having a first passband and an input coupled to an output of the audio amplification device, and having an output for use in deriving a first input to the means for setting coefficients of the adaptive filter;

a second band limiting filter having a second passband and an input coupled to the audio signal path ahead of the amplifier, and having an output for use in deriving a second input to the means for setting coefficients of the adaptive filter;

whereby the adaptive filter response approximates an external feedback path of the audio amplification device within the first and second passbands.

2. The feedback canceller of claim 1 wherein the audio amplification device comprises a hearing aid.

3. The feedback canceller of claim 1 further comprising delay means inserted between the output of the audio amplification device and the input of the first band limiting filter.

4. The feedback canceller of claim 1 further comprising a filter inserted between the output of the first band limiting filter and the means for setting coefficients.

5. The feedback canceller of claim 1 further comprising means for subtracting the output of the adaptive filter from the output of the second band limiting filter to derive the second input to the means for setting coefficients of the adaptive filter.

6. A method of canceling feedback in an audio amplification device having an audio signal path including an amplifier, the method comprising:

tapping the audio signal path at an output of the audio amplification device to provide an input to a first band limiting filter having a first passband;

deriving from an output of the first band limiting filter a first input to a means for setting coefficients of an adaptive filter;

tapping the audio signal path ahead of the amplifier to provide an input to a second band limiting filter having a second passband;

deriving from an output of the second band limiting filter a second input to the means for setting coefficients of the adaptive filter; and combining an output of the adaptive filter with an input of the audio amplification device;

whereby the adaptive filter response approximates an external feedback path of the audio amplification device within the first and second passbands.

7. The method of claim 6 wherein the audio amplification device comprises a hearing aid.

8. The method of claim 6 further comprising delaying the output of the audio amplification device before providing the input to the first band limiting filter.

9. The method of claim 6 wherein deriving from the output of the first band limiting filter the first input to the means for setting coefficients of the adaptive filter includes further filtering.

10. The method of claim 6 wherein deriving from the output of the second band limiting filter the second input to the means for setting coefficients of the adaptive filter includes subtracting the output of the adaptive filter from the output of the second band limiting filter.

11. A feedback canceller for an audio amplification device having an audio signal path including an amplifier, the feedback canceller comprising:

an adaptive filter;

a coefficient adaptation module for setting coefficients of the adaptive filter;

a summing node for combining an output of the adaptive filter with an input of the audio amplification device;

a first band limiting filter having a first passband and an input coupled to an output of the audio amplification device, and having an output for use in deriving a first input to the coefficient adaptation module;

a second band limiting filter having a second passband and an input coupled to the audio signal path ahead of the amplifier, and having an output for use in deriving a second input to the coefficient adaptation module;

whereby the adaptive filter response approximates an external feedback path of the audio amplification device within the first and second passbands.

12. The feedback canceller of claim 11 wherein the audio amplification device comprises a hearing aid.

13. The feedback canceller of claim 11 further comprising a delay block between the output of the audio amplification device and the input of the first band limiting filter.

14. The feedback canceller of claim 11 further comprising a filter between the output of the first band limiting filter and the coefficient adaptation module.

15. The feedback canceller of claim 11 further comprising a subtracting node for subtracting the output of the adaptive filter from the output of the second band limiting filter to derive the second input to coefficient adaptation module.

* * * * *